United States Patent
Yamaoka et al.

(10) Patent No.: US 8,531,872 B2
(45) Date of Patent: *Sep. 10, 2013

(54) SEMICONDUCTOR INTEGRATED CIRCUIT AND MANUFACTURING METHOD THEREOF

(75) Inventors: Masanao Yamaoka, Kodaira (JP); Kenichi Osada, Tokyo (JP); Shigenobu Komatsu, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/350,340

(22) Filed: Jan. 13, 2012

(65) Prior Publication Data

US 2012/0147662 A1 Jun. 14, 2012

Related U.S. Application Data

(63) Continuation of application No. 12/563,231, filed on Sep. 21, 2009, now Pat. No. 8,107,279, which is a continuation of application No. 11/943,495, filed on Nov. 20, 2007, now Pat. No. 7,596,013.

(30) Foreign Application Priority Data

Dec. 18, 2006 (JP) ................. 2006-339627

(51) Int. Cl.
*G11C 11/00* (2006.01)

(52) U.S. Cl.
USPC .. 365/154; 365/155; 365/189.17; 365/230.06

(58) Field of Classification Search
USPC .................. 365/154, 155, 189.17, 230.06
See application file for complete search history.

(56) References Cited

U.S. PATENT DOCUMENTS 6,473,331 B1 * 10/2002 Takashima ............... 365/145
6,657,882 B2 * 12/2003 Takashima ............... 365/145
(Continued)

FOREIGN PATENT DOCUMENTS

| JP | 05-054672 A | 3/1993 |
| JP | 11-039879 A | 2/1999 |

(Continued)

OTHER PUBLICATIONS

Mizuno et al., "A 18μA-Standby-Current 1.8V 200MHz Microprocessor with Self Substrate-Biased Data-Retention Mode", 1999 IEEE International Solid-State Circuits Conference Digest of Technical Papers, ISSCC99/Session 16/ Paper TP 16.4, pp. 280-281.

(Continued)

*Primary Examiner* — Pho M Luu
(74) *Attorney, Agent, or Firm* — Miles & Stockbridge P.C.

(57) ABSTRACT

High manufacturing yield is realized and variation in threshold voltage of each MOS transistor in a CMOS·SRAM is compensated. Body bias voltages are applied to wells for MOS transistors of each SRAM memory cell in any active mode of an information holding operation, a write operation and a read operation of an SRAM. Threshold voltages of PMOS and NMOS transistors of the SRAM are first measured. Control information is programmed into control memories according to results of determination. Levels of the body bias voltages are adjusted based on the programs so that variations in the threshold voltages of the MOS transistors of the CMOS·SRAM are controlled to a predetermined error span. Body bias voltage corresponding to a reverse body bias or an extremely shallow forward body bias is applied to a substrate for the MOS transistors with an operating voltage applied to the source of each MOS transistor.

4 Claims, 12 Drawing Sheets

(56) References Cited

U.S. PATENT DOCUMENTS

| | | | |
|---|---|---|---|
| 6,657,911 B2 * | 12/2003 | Yamaoka et al. | 365/226 |
| 7,272,068 B2 | 9/2007 | Yamaoka et al. | |
| 7,382,674 B2 | 6/2008 | Hirabayashi | |
| 7,420,857 B2 | 9/2008 | Hirota et al. | |
| 7,474,584 B2 * | 1/2009 | Yamaoka et al. | 365/226 |
| 7,596,013 B2 * | 9/2009 | Yamaoka et al. | 365/154 |
| 7,646,662 B2 | 1/2010 | Yamaoka et al. | |
| 7,821,814 B2 | 10/2010 | Yamaoka et al. | |
| 8,107,279 B2 * | 1/2012 | Yamaoka et al. | 365/154 |
| 2003/0076705 A1 | 4/2003 | Yamaoka et al. | |
| 2003/0223276 A1 | 12/2003 | Yamaoka et al. | |
| 2004/0232567 A1 | 11/2004 | Ikeda | |
| 2005/0276094 A1 | 12/2005 | Yamaoka et al. | |
| 2009/0129142 A1 | 5/2009 | Yamaoka et al. | |

FOREIGN PATENT DOCUMENTS

| | | |
|---|---|---|
| JP | 2004-005777 A | 5/2002 |
| JP | 2003-132683 A | 5/2003 |
| JP | 2004-349530 A | 12/2004 |
| JP | 2006-004974 A | 1/2006 |

OTHER PUBLICATIONS

Office Action in Japanese Application No. JP 2006-339627 dated Dec. 16, 2011.

* cited by examiner

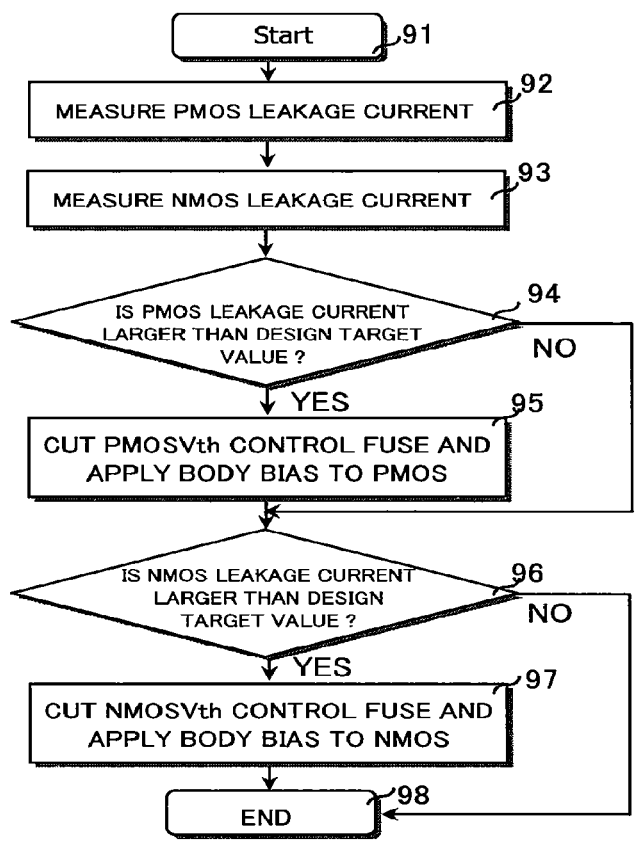

SEMICONDUCTOR INTEGRATED CIRCUIT AND MANUFACTURING METHOD THEREOF

CROSS REFERENCE TO RELATED APPLICATIONS

This application is a continuation of U.S. patent application Ser. No. 12/563,231 filed Sep. 21, 2009 (now U.S. Pat. No. 8,107,279 issued Jan. 31, 2012), which is a continuation of U.S. patent application Ser. No. 11/943,495 filed Nov. 20, 2007(now U.S. Pat. No. 7,596,013 issued Sep. 29, 2009).

CLAIM OF PRIORITY

The present application claims priority from Japanese application JP 2006-339627 filed on Dec. 18, 2006, the content of which is hereby incorporated by reference into this application.

FIELD OF THE INVENTION

The present invention relates to a semiconductor integrated circuit and a manufacturing method thereof, and particularly to a technology which enables high manufacturing yield and is beneficial to compensate for variations in threshold voltage of each MOS transistor of a CMOS·SRAM.

BACKGROUND OF THE INVENTION

With a short channel effect caused by miniaturization of a semiconductor device, the threshold voltage of each MOS transistor has been lowered and an increase in subthreshold leakage current has been manifested. A characteristic not greater than the threshold voltage of each MOS transistor is of a subthreshold characteristic, and a leakage current at which a MOS silicon surface is in a weak inversion state, is called a subthreshold leakage current. As a method of reducing such a leakage current, a body bias technique has been well known. The subthreshold leakage current can be reduced by applying a predetermined body bias voltage to a semiconductor substrate (called "well" in the case of a CMOS) formed with MOS transistors.

A non-patent document 1 has described that a body bias voltage is switched between an active mode and a standby mode. In the active mode, an NMOS body bias voltage Vbn applied to a P well for each NMOS of a CMOS is set to a ground voltage Vss (0 volts) applied to an N type source of each NMOS. A PMOS body bias voltage Vbp applied to an N well for each PMOS of the CMOS is set to a source voltage Vdd (1.8 volts) applied to a P type source of each PMOS. In the standby mode that reduces a subthreshold leakage current, the NMOS body bias voltage Vbn applied to the P well is set to a negative voltage (−1.5 volts) corresponding to a reverse body bias with respect to the ground voltage Vss (0 volts) applied to the N type source of each NMOS of the CMOS. The PMOS body bias voltage Vbp applied to the N well is set to a positive voltage (3.3 volts) corresponding to a reverse body bias with respect to the source voltage (1.8 volts) applied to the P type source of each PMOS of the CMOS.

There has been a strong demand for speeding-up and low power consumption of an SRAM (Static Random Access Memory). There is provided a method in which lowering a source voltage to reduce power consumption of the SRAM is the simplest and large in effect. At a low source voltage, however, an operating margin necessary for the operation of each transistor is reduced and its operation becomes unstable.

With the foregoing in view, a technique for controlling a body bias voltage of each transistor constituting an SRAM cell according to write/read operations thereby to provide speeding-up at writing and reduce power consumption at reading has been disclosed in a patent document 1. In a manner similar to the patent document 1, a patent document 2 has disclosed that a body bias voltage is controlled according to write/read operations and a storage retention or holding operation to provide body bias voltages most suitable for the respective operations, thereby enhancing performance at the respective operations. Alternatively, a technique for controlling a body bias voltage of a SRAM memory cell at standby thereby to reduce a leakage current has been disclosed in a patent document 3.

[Non-patent document 1] Hiroyuki Mizuno et al, "A 18 µA—Standby—Current 1.8V 200 MHz Microprocessor with Self Substrate—Biased Data—Retention Mode", 1999 IEEE International Solid—State Circuits Conference DIGEST OF TECHNICAL PAPPERS, pp. 280-281, 468

[Patent Document 1] Japanese Patent Laid Open No. Hei 11(1999)-39879

[Patent Document 2] Japanese Patent Laid-Open No. 2004-349530

[Patent Document 3] Japanese Patent Laid-Open No. 2003-132683

SUMMARY OF THE INVENTION

The conventional body bias technology described in the non-patent document 1 aims to reduce the subthreshold leakage current in the standby mode by a reduction in the threshold voltage of each MOS transistor with the miniaturization of the semiconductor device. However, chip-to-chip variations in the threshold voltage of the MOS transistor have been manifested with further miniaturization of the semiconductor device. That is, when the threshold voltage of the MOS transistor is excessively low, a semiconductor integrated circuit leads to a significant increase in operating power consumption in the active mode for performing signal processing of a digital input signal and an analog input signal. When the threshold voltage of the MOS transistor is excessively high in reverse, the semiconductor integrated circuit is greatly reduced in operating speed in the active mode for carrying out the signal processing of the digital input signal and the analog input signal. As a result, a process window for the threshold voltage of each MOS transistor at the manufacture of a MOSLSI is extremely narrowed and the manufacturing yield of the MOSLSI is significantly reduced.

On the other hand, prior to the present invention, the present inventors have been involved in the development of a system LSI with an SRAM (Static Random Access Memory) built therein. On the other hand, an SRAM memory cell is constituted of a CMOS to reduce or cut down power consumption of the SRAM memory cell. That is, in the memory cell, a driver MOS is constituted of a pull-down NMOS, and a load MOS is constituted of a pull-up PMOS. A transfer MOS provided between an information storage node of the memory cell and a data line is constituted of an NMOS easy to obtain high conductance as compared with a PMOS.

Prior to the present invention, the present inventors have encounters the problem that when the threshold voltage of the transfer NMOS is excessively low due to variations in the manufacturing process of the SRAM constituted of the CMOS, normal reading from the SRAM memory cell is made impossible, whereas when the absolute value of the threshold voltage of the load PMOS is excessively low, normal writing into the SRAM memory cell is made impossible. When the threshold voltages of the NMOS and PMOS of the SRAM constituted of the CMOS are excessively high in reverse, a low source or power-supply voltage operation of the SRAM is made impossible. As a result, a process window for the threshold voltage of each of the NMOS and PMOS of the CMOS at the manufacture of the SRAM is extremely narrowed and the manufacturing yield of the CMOS·SRAM is significantly reduced.

On the other hand, an LSI (Large Scale Integrated circuit) has a tendency to reduce a source voltage of the LSI for the purpose of reducing power consumption and miniaturizing each transistor in the LSI. In a 90 nm process, for example, an LSI operated at a source voltage of 1.2 volts is manufactured. When, however, the source voltage is lowered, operation stability at the write/read operation of the SRAM is degraded, thus causing difficulty in operation. When drive capacity or currents of the respective transistors that constitute each memory cell are reduced, the respective performance of write/read stability and operating speeds are degraded. In the patent documents 1 and 2, the body bias voltage of each transistor that constitutes the memory cell is controlled to set the drive power of the transistor in the memory cell suitably, thereby enhancing operation stability at the writing/reading of the memory cell. In the techniques described in the patent documents 1 and 2, however, there is a need to change the body bias voltage. On the other hand, the present SRAM needs to complete write and read access operations in about 10 nSecs at a low-speed SRAM and complete the same in about 1 nSec at a fast SRAM. Under such a circumstance that such fast access is required, however, adopting the technique of changing the body bias voltage, which has been described in each of the patent documents 1 and 2, is in a difficult situation. This is because it is so difficult to change a body bias voltage having large parasitic resistance and large parasitic capacitance to a desired value in a short period of time. When the access operation is started after the completion of the change of the body bias voltage in reverse, the present SRAM assumes an unallowable access speed. Further, since substrate nodes of all memory cells are constituted by one well in the layout of the present SRAM memory cells, they are all electrically coupled in common. Each of isolation regions for dividing the substrate nodes takes a large chip exclusively possessed area, thus causing a problem that an LSI chip area increases. Further, a problem arises in that a problem of large power consumption due to high-capacity charging/discharging is associated with a change in body bias voltage at each substrate node having large parasitic capacitance.

In the patent document 3, the body bias voltage of each transistor of the SRAM memory cell is controlled to raise the threshold voltage Vth of the transistor, thereby realizing a reduction in power consumption at its non-operation. It has however been revealed by the investigations made by the present inventors prior to the present invention that it is difficult to apply the technique described in the patent document 3 in a micro-fabrication process subsequent to the 90 nm process. That is, a further reduction in the threshold voltage Vth and a variation in the threshold voltage Vth per transistor increase in the micro-fabrication process subsequent to the 90 nm process. Thus, the problem that the leakage current of the entire SRAM becomes large, and power consumption becomes with an increase in leakage current even at not only standby but also write and read circuit operations, has been revealed.

Thus, an object of the present invention is to enable high manufacturing yield and compensate for variations in threshold voltage of each MOS transistor in a CMOS·SRAM.

The above, other objects and novel features of the present invention will become apparent from the description of the present specification and the accompanying drawings.

A representative one of the inventions disclosed in the present application will be explained in brief as follows:

In a typical semiconductor integrated circuit of the present invention, an active body bias technique has been adopted in a CMOS·SRAM. In the active body bias technique, a body bias voltage is applied to a substrate for each MOS transistor in any active mode of an information retention or holding operation, a write operation and a read operation of the SRAM in the semiconductor integrated circuit. In the active body bias technique, the threshold voltage of each MOS transistor is first measured. If a variation in the threshold voltage is large, then the level of the body bias voltage is adjusted to control the variation to a predetermined margin of error. A body bias voltage corresponding to a reverse body bias or an extremely shallow forward body bias is applied to the substrate (well) for each MOS transistor with respect to an operating voltage applied to the source of each MOS transistor. Adopting the active body bias technique in this way enables high manufacturing yield and makes it possible to compensate for the variations in the threshold voltage of each MOS transistor of the CMOS·SRAM.

Advantageous effects obtained by the typical one of the inventions disclosed in the present application will be explained in brief as follows:

According to the present invention, it is possible to enable high manufacturing yield and compensate for variations in threshold voltage of each MOS transistor of a CMOS·SRAM.

BRIEF DESCRIPTION OF THE DRAWINGS

FIG. 23 is a diagram for describing a semiconductor integrated circuit manufacturing method including a wafer test and a wafer process of the semiconductor integrated circuit shown in FIG. 1.

DETAILED DESCRIPTION OF THE PREFERRED EMBODIMENTS

<<Typical embodiments>>

Figure 1:
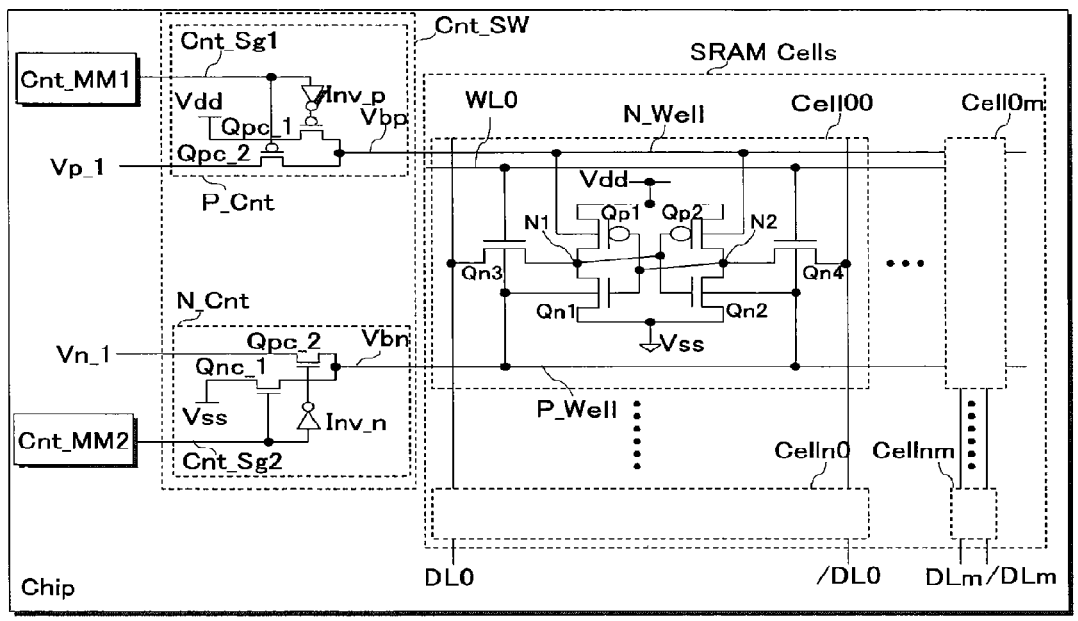
FIG. 1 is a circuit diagram showing a semiconductor integrated circuit according to one embodiment of the present invention.

Summaries of typical embodiments of the present invention disclosed in the present application will first be explained. Reference numerals in the drawings referred to the description of the summaries thereof with parentheses applied thereto merely illustrate ones contained in the concepts of constituent elements respectively marked with the reference numerals.

[1] A semiconductor integrated circuit (Chip) according to a typical embodiment of the present invention includes a CMOS embedded SRAM inside a chip. Each of memory cells of the CMOS embedded SRRAM includes a pair of driver NMOSs (Qn1 and Qn2), a pair of load PMOSs (Qp1 and Qp2), and a pair of transfer NMOSs (Qn3 and Qn4). The semiconductor integrated circuit includes a embedded SRAM control switch (Cnt_sw) which supplies a PMOS body bias voltage (Vbp) and an NMOS body bias voltage (Vbn) to N wells for a plurality of PMOSs (Qp1 and Qp2) of the CMOS embedded SRAM and P wells for a plurality of NMOSs (Qn1 and Qn2) thereof in any active mode of at least an information holding operation, a write operation and a read operation respectively. The semiconductor integrated circuit further includes embedded SRAM control memories (Cnt_MM1 and Cnt_MM2) which store embedded SRAM control information (Cnt_Sg1 and Cnt_Sg2) indicative of whether the PMOS body bias voltage and the NMOS body bias voltage are respectively supplied to the N wells for the PMOSs of the CMOS embedded SRAM and the P wells for the NMOSs thereof through the embedded SRAM control switch (refer to FIG. 1).

Thus, according to the embodiment, when the threshold voltage of each of the PMOSs and NMOSs in the CMOS embedded SRAM is an excessively low value, the control information stored in the control memories are respectively set to a low threshold state. In doing so, the PMOS body bias voltage and the NMOS body bias voltage each corresponding to a reverse body bias relative to a source operating voltage are respectively supplied to the N wells for the PMOSs of the CMOS embedded SRAM and the P wells for the NMOSs thereof through the control switch controlled by the control information stored in the control memories. As a result, each of the threshold voltages of the PMOSs and the NMOSs of the CMOS embedded SRAM can be increased from the excessively low value to a proper value.

When the threshold voltage of each of the PMOSs and NMOSs of the CMOS embedded SRAM is of a proper value, the control information stored in each of the control memories is set to a proper threshold state. In doing so, the PMOS body bias voltage and the NMOS body bias voltage each corresponding to a voltage level approximately identical to a source operating voltage are respectively supplied to the N wells for the PMOSs of the CMOS embedded SRAM and the P wells for the NMOSs thereof through the control switch controlled by the control information stored in the control memories. As a result, each of the threshold voltages of the PMOSs and the NMOSs of the CMOS embedded SRAM can be maintained at a proper value and operation power consumption in the active mode can be maintained at a proper value.

When the threshold voltage of each of the PMOSs and NMOSs in the CMOS embedded SRAM is an excessively high value, the control information stored in the control memories are respectively set to a high threshold state. In doing so, the PMOS body bias voltage and the NMOS body bias voltage each corresponding to a forward body bias relative to a source operating voltage are respectively supplied to the N wells for the PMOSs of the CMOS embedded SRAM and the P wells for the NMOSs thereof through the control switch controlled by the control information stored in the control memories. As a result, each of the threshold voltages of the PMOSs and the NMOSs of the CMOS embedded SRAM can be lowered from the excessively high value to a proper value, thereby making it possible to enhance an operating speed in the active mode.

Thus, according to the embodiment, it is possible to enable high manufacturing yield and compensate for variations in the threshold voltage of each MOS transistor of the CMOS·SRAM.

In a semiconductor integrated circuit according to a preferred embodiment, the control memories are nonvolatile memories. Discrimination information on whether the threshold voltages of at least one of the PMOSs and NMOSs of the CMOS embedded SRAM are low or high are storable in the nonvolatile memories corresponding to the control memories (refer to FIGS. 6(a) and 6(b)).

Thus, according to the preferred embodiment, it is possible to compensate for variations in the threshold voltages of the PMOSs and NMOSs of the CMOS embedded SRAM by simply executing once discrimination as to whether the threshold voltages of at least one of the PMOSs and NMOSs of the CMOS embedded SRAM are low or high.

In a semiconductor integrated circuit according to a more preferred embodiment, a first operating voltage (Vdd) is supplied to sources of the PMOSs of the CMOS embedded SRAM, and a second operating voltage (Vss) is supplied to sources of the driver NMOSs. The semiconductor integrated circuit includes a first voltage generator (CP_P) which generates the PMOS body bias voltage corresponding to a level higher than the first operating voltage, and a second voltage generator (CP_N) which generates the NMOS body bias voltage corresponding to a level lower than the second operating voltage (refer to FIG. 13).

Thus, according to the more preferred embodiment, the PMOS body bias voltage and the NMOS body bias voltage can be produced at reduced operating voltage supply terminals.

In a semiconductor integrated circuit according to one specific embodiment, a first operating voltage is supplied to sources of the PMOSs of the CMOS embedded SRAM, and a second operating voltage is supplied to sources of the driver NMOSs. The PMOS body bias voltage supplied to the N wells is set to a reverse body bias with respect to the first operating voltage supplied to the sources of the PMOSs of the CMOS embedded SRAM. The NMOS body bias voltage supplied to the P wells is set to a reverse body bias with respect to the second operating voltage supplied to the sources of the NMOSs of the CMOS embedded SRAM. The PMOS body bias voltage set to the level higher than the first operating voltage is supplied to the N wells thereby to control the PMOSs each having the N well to a state of a low leakage current at a high threshold voltage. The NMOS body bias voltage set to the level lower than the second operating voltage is supplied to the P wells thereby to control the NMOSs each having the P well to a state of a low leakage current at a high threshold voltage (refer to FIG. 5).

In a semiconductor integrated circuit according to another specific embodiment, a first operating voltage is supplied to sources of the PMOSs of the CMOS embedded SRAM, and a second operating voltage is supplied to sources of the driver NMOSs. The PMOS body bias voltage supplied to the N wells is set to a forward body bias with respect to the first operating voltage supplied to the sources of the PMOSs of the CMOS embedded SRAM. The NMOS body bias voltage supplied to the P wells is set to a forward body bias with respect to the second operating voltage supplied to the sources of the NMOSs of the CMOS embedded SRAM. The PMOS body bias voltage set to the level lower than the first operating voltage is supplied to the N wells thereby to control the PMOSs each having the N well to a state of a high leakage current at a low threshold voltage. The NMOS body bias voltage set to the level higher than the second operating voltage is supplied to the P wells thereby to control the NMOSs each having the P well to a state of a high leakage current at a low threshold voltage (refer to FIGS. 17, 18(a) and 18(b)).

In a semiconductor integrated circuit according to a further specific embodiment, the control switch includes a first control switch (P_Cnt) which supplies the PMOS body bias voltage to the N wells for the PMOSs of the CMOS embedded SRAM, and a second control switch (N_Cnt) which supplies the NMOS body bias voltage to the P wells for the NMOSs of the CMOS embedded SRAM. The control memories include a first control memory (Cnt_MM1) and a second control memory (Cnt_MM2). The first control memory stores therein first control information (Cnt_Sg1) indicative of whether the PMOS body bias voltage is supplied to the N wells for the PMOSs of the CMOS embedded SRAM through the first control switch during at least the active mode. The second control memory stores therein second control information (Cnt_Sg2) indicative of whether the NMOS body bias voltage is supplied to the P wells for the NMOSs of the CMOS embedded SRAM through the second control switch during at least the active mode (refer to FIG. 1).

Figure 2:
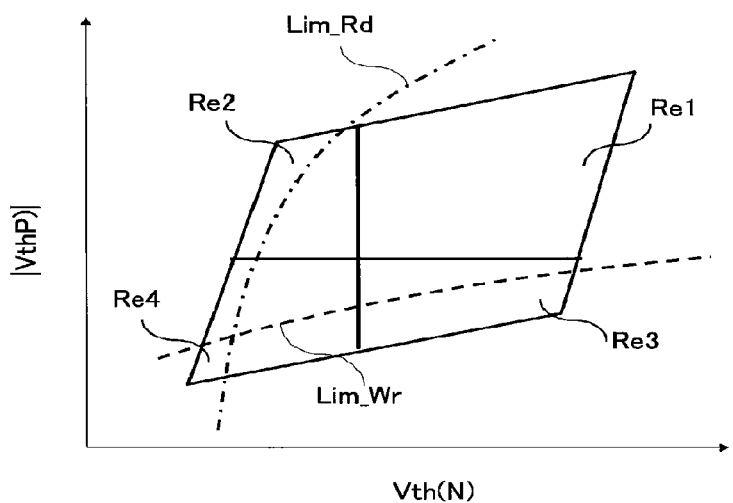
FIG. 2 is a diagram showing electrical characteristics of SRAM memory cells that depend upon variations in threshold voltages of NMOSs thereof and threshold voltages of PMOSs thereof.

Thus, according to the further specific embodiment, it is possible to independently compensate for independent variations in the threshold voltages of both MOS transistors of the PMOS and NMOS in the CMOS embedded SRAM (refer to FIG. 2).

In a semiconductor integrated circuit according to a still further specific embodiment, a first sense circuit (Idd_Sense) which senses a leakage current characteristic of each of the PMOSs of the CMOS embedded SRAM, a second sense circuit (Iss_Sense) which senses a leakage current characteristic of each of the NMOSs of the CMOS embedded SRAM, and a control unit are contained inside the chip. The control unit stores new control information in the control memories when the measured leakage currents of the PMOS and NMOS are varying from the previous values exceeding a predetermined allowable range (refer to FIG. 21).

Thus, according to the still further specific embodiment, it is possible to compensate for variations in the threshold voltages of the PMOSs and NMOSs of the CMOS embedded SRAM due to variations with time due to LSI's harsh stress over a long period of time.

In a semiconductor integrated circuit according to a still further specific embodiment, each of the PMOSs of the CMOS embedded SRAM is a PMOS of an SOI structure. Each of the NMOSs of the CMOS embedded SRAM is an NMOS of an SOI structure. Sources and drains of the PMOSs and sources and drains of the NMOSs are formed in silicon lying over an insulator of the SOI structure. The N well (N_Well) for the PMOSs and the P well (P_Well) for the NMOSs are formed in a silicon substrate (P_Sub) disposed below the insulator of the SOI structure (refer to FIG. 22).

Thus, according to the still further specific embodiment, it is possible to provide an SRAM which is capable of reducing capacitance between the drain and the well and is fast and low in power consumption.

[2] A semiconductor integrated circuit according to another aspect includes a embedded SRAM inside a chip. Each of memory cells of the embedded SRAM includes a pair of driver MOSs (Qn1 and Qn2), a pair of load elements (Qp1 and Qp2), and a pair of transfer MOSs (Qn3 and Qn4). The semiconductor integrated circuit includes a control switch (Cnt_SW) which supplies a MOS body bias voltage (Vbn) to wells for a plurality of MOSs (Qn1, Qn2, Qn3 and Qn4) in the embedded SRAM. The semiconductor integrated circuit further includes control memories (Cnt_MM1 and Cnt_MM2) which store therein control information (Cnt_Sg1 and Cnt_Sg2) indicative of whether the MOS body bias voltage is supplied to the N wells for the MOSs of the embedded SRAM through the control switch in any active mode of at least an information holding operation, a write operation and a read operation (refer to FIG. 1).

According to the embodiment, it is possible to enable high manufacturing yield and compensate for variations in threshold voltage of each MOS transistor of the SRAM.

In a semiconductor integrated circuit according to a preferred embodiment, the control memories are nonvolatile memories. Discrimination information on whether the threshold voltages of the MOSs of the embedded SRAM are low or high are storable in the nonvolatile memories corresponding to the control memories (refer to FIGS. 6(a) and 6(b)).

In a semiconductor integrated circuit according to a more preferred embodiment, an operating voltage is supplied to sources of the MOSs of the embedded SRAM. The semiconductor integrated circuit includes a voltage generator that generates the MOS body bias voltage corresponding to a level larger than the operating voltage.

Thus, according to the more preferred embodiment, the MOS body bias voltage can be generated at a reduced operating voltage supply terminal.

In a semiconductor integrated circuit according to a specific embodiment, an operating voltage is supplied to sources of the MOSs of the embedded SRAM. The MOS body bias voltage supplied to the wells is set to a reverse body bias with respect to the operating voltage supplied to the sources of the MOSs of the embedded SRAM. The MOS body bias voltage set to the level larger than the operating voltage is supplied to the wells thereby to control the MOSs each having the well to a state of a low leakage current at a high threshold voltage (refer to FIG. 5).

In a semiconductor integrated circuit according to another specific embodiment, an operating voltage is supplied to sources of the MOSs of the embedded SRAM. The MOS body bias voltage supplied to the wells is set to a forward body bias with respect to the operating voltage supplied to the sources of the MOSs of the embedded SRAM. The MOS body bias voltage set to a level smaller than the operating voltage is supplied to the wells thereby to control the MOSs each having the well to a state of a high leakage current at a low threshold voltage (refer to FIGS. 17, 18(a) and 18(b)).

In a semiconductor integrated circuit according to a further specific embodiment, a sense circuit which senses a leakage current characteristic of each of the MOSs of the embedded SRAM, and a control unit are contained inside a chip. The control unit stores new control information in the control memories when the measured leakage currents of the MOSs are varying from the previous values exceeding a predetermined allowable range (refer to FIG. 21).

Thus, according to the further specific embodiment, it is possible to compensate for variations in the threshold voltages of the MOSs of the embedded SRAM due to variations with time due to LSI's harsh stress over a long period of time.

In a semiconductor integrated circuit according to a still further specific embodiment, each of the MOSs of the embedded SRAM is a MOS of an SOI structure. Sources and drains of the MOSs are formed in silicon lying over an insulator of the SOI structure. The well (P_Well) for the MOSs is formed in a silicon substrate (P_Sub) disposed below the insulator of the SOT structure (refer to FIG. 22).

Thus, according to the still further specific embodiment, it is possible to provide an SRAM which is capable of reducing capacitance between the drain and the well and is fast and low in power consumption.

[3] A method for manufacturing a semiconductor integrated circuit, according to another embodiment of the present invention includes a step of preparing a wafer including a chip (Chip) of the semiconductor integrated circuit including a CMOS embedded SRAM (SRAM Cells), a control switch (Cnt_SW) and control memories (Cnt_MM) (Step 91 in FIG. 23). The control switch supplies a PMOS body bias voltage (Vbp) and an NMOS body bias voltage (Vbn) to N wells (N_Well) for PMOSs (Qp1) of the CMOS embedded SRAM and P wells (P_Well) for NMOSs (Qn1) thereof in any active mode of at least an information holding operation, a write operation and a read operation of the CMOS embedded SRAM respectively. The control memories are nonvolatile memories and store, on a nonvolatile basis, control information (Cnt_Sg1 and Cnt_Sg2) indicative of whether the PMOS body bias voltage and the NMOS body bias voltage are respectively supplied to the N wells for the PMOSs of the CMOS embedded SRAM and the P wells for the NMOSs thereof through the control switch during at least the active mode.

The method includes a step of measuring a threshold voltage of at least one of the PMOS and NMOS of the CMOS embedded SRAM (Steps 92 and 93 in FIG. 23).

The method includes a step of determining whether the measured threshold voltage is lower than a target (Steps 94 and 96 in FIG. 23).

The method includes a step for storing the result of determination in the corresponding control memory as the control information on a nonvolatile basis (Steps 94 and 96 in FIG. 23).

A method for manufacturing a semiconductor integrated circuit, according to a preferred embodiment includes a step of measuring threshold voltages of the PMOSs of the CMOS embedded SRAM (Step 92 in FIG. 23).

The method includes a step of measuring threshold voltages of the NMOSs of the CMOS embedded SRAM (Step 93 in FIG. 23).

The method includes a step of determining whether each of the measured threshold voltages of the FMOSs is lower than a target (Step S94 in FIG. 23).

The method includes a step of determining whether each of the measured threshold voltages of the NMOSs is lower than a target (Step 96 in FIG. 23).

The method includes a step of storing the result of determination of the PMOSs in the corresponding control memory as the control information on a nonvolatile basis (Step 95 in FIG. 23).

The method includes a step of storing the result of determination of the NMOSs in the corresponding control memory as the control information on a nonvolatile basis (Step 97 in FIG. 23).

<<Description of Embodiments>>

Preferred embodiments will next be described in further detail.

<<Configuration of Semiconductor Integrated Circuit>>

FIG. 1 is a circuit diagram showing a semiconductor integrated circuit according to one embodiment of the present invention. In the same drawing, a chip Chip of the semiconductor integrated circuit includes a (Static Random Access Memory) SRAM. A plurality of cells Cell00, ... and Cellnm disposed in the form of a matrix with n rows and m columns are 1-bit SRAM memory cells respectively. The chip Chip of the semiconductor integrated circuit includes control memories Cnt_MM1 and Cnt_MM2 and a control switch Cnt_SW for compensating for variations in the characteristic of the SRAM. The control switch Cnt_SW includes a PMOS controller P_Cnt and an NMOS controller N_Cnt.

<<Configuration of SRAM Memory Cell>>

The 1-bit SRAM memory cell Cell00 includes, for example, PMOSs Qp1 and Qp2 whose sources are coupled to a source or power supply voltage Vdd, NMOSs Qn1 and Qn2 whose sources are coupled to a ground voltage Vss, and NMOSs Qn3 and Qn4 whose gates are coupled to a word line WL0. The PMOSs Qp1 and Qp2 are operated as a pair of load transistors, the NMOSs Qn1 and Qn2 are operated as a pair of driver transistors, and the NMOSs Qn3 and Qn4 are operated as a pair of transfer transistors, respectively. The drain of the load PMOS Qp1 and the drain of the driver NMOS Qn1 are coupled to one storage retention or holding node N1. The drain of the load PMOS Qp2 and the drain of the driver NMOS Qn2 are coupled to the other storage holding node N2. The gate of the load PMOS Qp1 and the gate of the driver NMOS Qn1 are coupled to the other storage holding node N2. The gate of the load PMOS Qp2 and the gate of the driver NMOS Qn2 are coupled to the one storage holding node N1. As a result, storage information of the pair of storage holding nodes N1 and N2 can be held in an information holding mode during which the pair of transfer MOS transistors Qn3 and Qn4 are off at a low level at which the word line WL0 is at a non-selection level.

In an information write mode, the word line WL0 is driven to a high level corresponding to a selection level so that the pair of transfer MOS transistors Qn3 and Qn4 are respectively brought to an on state. Information of a pair of data lines DL0 and /DL0 are written into the pair of storage holding nodes N1 and N2 via the pair of transfer MOS transistors Qn3 and Qn4.

Even in an information read mode, the word line WL0 is driven to the high level corresponding to the selection level so that the pair of transfer MOS transistors Qn3 and Qn4 are respectively brought to the on state. The pair of data held at the pair of storage holding nodes N1 and N2 can be read into the pair of data lines DL0 and /DL0 via the pair of transfer MOS transistors Qn3 and Qn4.

<<Operating Limit of SRAM Memory Cell>>

FIG. 2 is a diagram showing electrical characteristics of SRAM memory cells that depend upon variations in both threshold voltages Vth (N) of NMOSs thereof and the absolute values |Vth (P)| of threshold voltages of PMOSs thereof. The horizontal axis in the same figure indicates the threshold voltage Vth (N) of each NMOS, and the vertical axis in the same figure indicates the absolute value |Vth (P)| of the threshold voltage of each PMOS, respectively. The same figure also shows a limit line Lim_Rd of a read operation of the SRAM memory cell, and a limit line Lim_Wr of a write operation thereof. Further, a rhombus constituted of regions Re1, Re2, Re3 and Re4 indicates a distribution of variations in both the threshold voltages Vth (N) of the NMOSs of the SRAM memory cells and the absolute values |Vth (P)| of the threshold voltages of the PMOSs thereof in the same figure.

<<Limit of Read Operation>>

When the distribution of the threshold voltages of the SRAM memory cells is located below the limit line Lim_Rd of the read operation in FIG. 2, the normal reading from each SRAM memory cell is enabled. When the distribution is located above the limit line Lim_Rd of the read operation in FIG. 2, the normal reading from each SRAM memory cell is made impossible. Locating the distribution above the limit line Lim_Rd of the read operation in FIG. 2 corresponds to the fact that the threshold voltage Vth (N) of each NMOS is excessively low as in the regions Re2 and Re4. Incidentally, the region Re4 indicates a state in which the absolute value |Vth (P)| of the threshold voltage of each PMOS is excessively low. The region Re2 indicates that the absolute value |Vth (P)| of the threshold voltage of each PMOS is set as a proper value. When the threshold voltage Vth (N) of the NMOS is excessively low as in the regions Re2 and Re4, the storage information of low level at one of the pair of storage holding nodes N1 and N2 causes corruption upon the read operation of the SRAM memory cell. This results from the fact that each of currents flowing through the pair of transfer MOS transistors Qn3 and Qn4 excessively increases with a reduction in the threshold voltage Vth (N) of each NMOS. That is, since the currents from the data lines DL0 and /DL0 flow into the low-level storage holding nodes via the transfer MOS transistors, the corruption of the low-level storage information occurs. Thus, a chip of MOSLSI located above the limit line Lim_Rd of the read operation in the regions Re2 and Re4 has been discarded as a defective unit until the present invention.

<<Limit of Write Operation>>

When the distribution of the threshold voltages of the SRAM memory cells is located above the limit line Lim_Wr of the write operation in FIG. 2, the normal writing from each SRAM memory cell is enabled. When the distribution is located below the limit line Lim_Wr of the write operation in FIG. 2, the normal writing from each SRAM memory cell is made impossible. Locating the distribution below the limit line Lim_Wr of the write operation in FIG. 2 corresponds to the fact that the absolute value |Vth (P)| of the threshold voltage of each PMOS is excessively low as in the regions Re3 and Re4. Incidentally, the region Re4 indicates a state in which the threshold voltage Vth (N) of each NMOS is also excessively low. The region Re3 indicates that the threshold voltage Vth (N) of each NMOS is set as a proper value. When the absolute value |Vth (P)| of the threshold voltage of the PMOS is excessively low as in the regions Re3 and Re4, the writing of a low level into the storage holding nodes cannot be performed upon the write operation of each SRAM memory cell. This results from the fact that each of currents flowing through the pair of load PMOS Qp1 and Qp2 increases excessively with a reduction in the absolute value |Vth (P)| of the threshold voltage of each PMOS. That is, since information of the pair of data lines DL0 and /DL0 are transmitted to the pair of storage holding nodes N1 and N2 via the pair of transfer MOS transistors Qn3 and Qn4 upon writing of each SRAM memory cell. With the transmission of the low-level side information in particular, new information can be written into the SRAM memory cell. Since, however, the currents flowing through the pair of load PMOSs Qp1 and Qp2 become excessive, the low-level side information is no longer transmitted. Accordingly, a chip of MOSLSI located below the limit line Lim_Wr of the write operation in the regions Re3 and Re4 in FIG. 2 has been discarded as a defective unit until the present invention.

<<Control Memory and Control Switch>>

In the chip Chip of the semiconductor integrated circuit according to the one embodiment of the present invention, the control memories Cnt_MM1 and Cnt_MM2 and the control switch Cnt_SW for compensating for the variations in the characteristics of the SRAM execute extremely important compensation functions.

In the one embodiment of the present invention, chips to be compensated for are selected from a wafer before compensation for the variations in the characteristics of the SRAM. The chips to be compensated for correspond to a chip of a low threshold voltage Vth (N) located above the limit line Lim_Rd of the read operation in the regions Re2 and Re4, and a chip of a low threshold voltage |Vth (P)| located below the limit line Lim_Wr of the write operation in the regions Re3 and Re4 in FIG. 2.

<<Program to Control Memories>>

NMOS low threshold voltage information is programmed into the control memory Cnt_MM2 of the chip of the low threshold voltage Vth (N) selected according to the wafer selection. PMOS low threshold voltage information is programmed into the control memory Cnt_MM1 of the chip of the low threshold voltage |Vth (P)| selected according to the wafer selection. Upon the early stage of the start of operation of the chip Chip for the MOSLSI into which the low threshold voltage information has been programmed, signals Cnt_Sg1 and Cnt_Sg2 outputted from the Cnt_MM1 and Cnt_MM2 are respectively brought to, for example, a ground voltage Vss (GND) of a low level.

<<Configuration of Control Switch>>

First, the PMOS controller P_Cnt comprises a PMOS Opc_1, a PMOS Opc_2 and an inverter Inv_p. In the PMOS controller P_Cnt, a source voltage Vdd is applied to the source of the PMOS Qpc_, and an N well bias voltage Vp_1 higher than the source voltage Vdd is applied to the source of the PMOS Qpc_2. The drain of the PMOS Qpc_1 and the drain of the PMOS Qpc_2 are coupled to an N well N_Well for the load PMOSs Qp1 and Qp2 of each SRAM memory cell.

The NMOS controller N_Cnt comprises an NMOS Qnc_, an NMOS Qnc_2 and an inverter Inv_n. In the NMOS controller N_Cnt, a ground voltage Vss is applied to the source of the NMOS Qnc_1, and a P well bias voltage Vn_1 lower than the ground voltage Vss is applied to the source of the NMOS Qnc_2. The drain of the NMOS Qnc_1 and the drain of the NMOS Qnc_2 are coupled to a P well P_Well for the driver NMOSs Qn1 and Qn2 and transfer NMOSs Qn3 and Qn4 of the SRAM memory cell.

<<Control of Body Bias Voltage by Control Switch>>

When the output signals Cnt_Sg1 and Cnt_Sgt of the control memories Cnt_MM1 and Cnt_MM2 are respectively brought to a high level, the PMOS Qpc_1 of the PMOS controller P_Cnt is turned on so that the NMOS Qnc_1 of the NMOS controller N_Cnt is turned on. In doing so, the source voltage Vdd is applied to the N well N_Well of the load PMOSs Qp1 and Qp2 of the SRAM memory cell as a PMOS body bias voltage Vbp. The ground voltage Vss is applied to the P well P_Well of the driver NMOSs Qn1 and Qn2 and transfer NMOSs Qn3 and Qn4 of the SRAM memory cell as an NMOS body bias voltage Vbn. On the other hand, the sources of the load PMOSs Qp1 and Qp2 of the SRAM memory cell and the sources of the driver NMOSs Qn1 and Qn2 thereof are respectively supplied with the source voltage Vdd and the ground voltage Vss. Thus, the source voltage Vdd is commonly applied to the sources of the load PMOSs Qp1 and Qp2 of the SRAM memory cell and the N well N_Well, and the ground voltage Vss is commonly applied to the sources of the driver NMOSs Qn1 and Qn2 and the P well P_Well.

When the output signal Cnt_Sg1 of the control memory Cnt_MM1 changes from the high to low level, the PMOS Qpc_2 of the PMOS controller P_Cnt is turned on. In doing so, the N well bias voltage Vp_1 higher than the source voltage Vdd is applied to the N well N_Well of the load PMOSs Qp1 and Qp2 of the SRAM memory cell as a PMOS body bias voltage Vbp. Since the source voltage Vdd is applied to the sources of the load PMOSs Qp1 and Qp2 of the SRAM memory cell, the high N well bias voltage Vp_1 applied to the N well N Well becomes a reverse body bias with respect to the source voltage Vdd applied to the sources of the load PMOSs Qp1 and Qp2 of the SRAM memory cell. As a result, the load PMOSs Qp1 and Qp2 of the SRAM memory cell can be controlled from a low threshold voltage to a high threshold voltage |Vth (P)|.

When the output signal Cnt_Sg2 of the control memory Cnt_MM2 changes from the high to low level, the NMOS Qnc_2 of the NMOS controller N_Cnt is turned on. In doing so, the P well bias voltage Vn_1 lower than the ground voltage Vss is applied to the P well P_Well of the driver NMOSs Qn1 and Qn2 and transfer NMOSs Qn3 and Qn4 as an NMOS body bias voltage Vbn. Since the ground voltage Vss is applied to the sources of the driver NMOSs Qn1 and Qn2 of the SRAM memory cell, the low P well bias voltage Vn_1 applied to the P well P_Well becomes a reverse body bias with respect to the ground voltage Vss applied to the sources of the driver NMOSs Qn1 and Qn2 of the SRAM memory cell. As a result, the driver NMOSs Qn1 and Qn2 of the SRAM memory cell and the transfer NMOSs Qn2 and Qn4 thereof can be controlled from a low threshold voltage to a high threshold voltage Vth (N).

Figure 3:
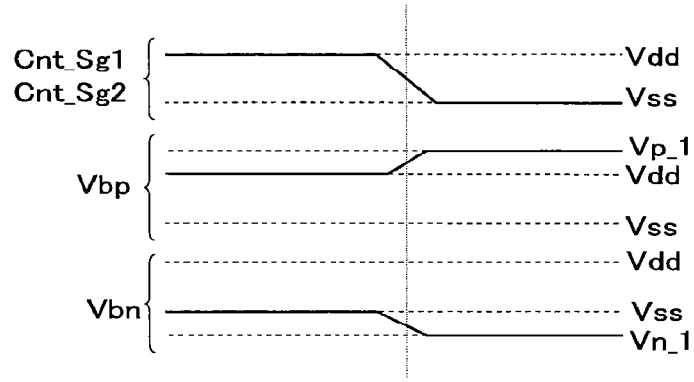
FIG. 3 is a diagram illustrating changes in PMOS body bias voltage of each load PMOS of the SRAM memory cell and NMOS body bias voltage of each driver NMOS and each transfer NMOS of the SRAM memory cell due to level changes in output signals of control memories shown in FIG. 1.

FIG. 3 is a diagram showing changes in the PMOS body bias voltage Vbp of the load PMOSs Qp1 and Qp2 of the SRAM memory cell and the NMOS body bias voltage Vbn of the driver NMOSs Qn1 and Qn2 and transfer NMOSs Qn3 and Qn4 of the SRAM memory cell due to level changes in the output signals Cnt_Sg1 and Cnt_Sg2 of the control memories Cnt_MM1 and Cnt_MM2. When the output signals change from the left to right in FIG. 3, the load PMOSs Qp1 and Qp2 of the SRAM memory cell can be controlled from a low threshold voltage to a high threshold voltage |Vth (P)|, and the driver NMOSs Qn1 and Qn2 and transfer NMOSs Qn3 and Qn4 of the SRAM memory cell can be controlled from a low threshold voltage to a high threshold voltage Vth (N).

Figure 4:
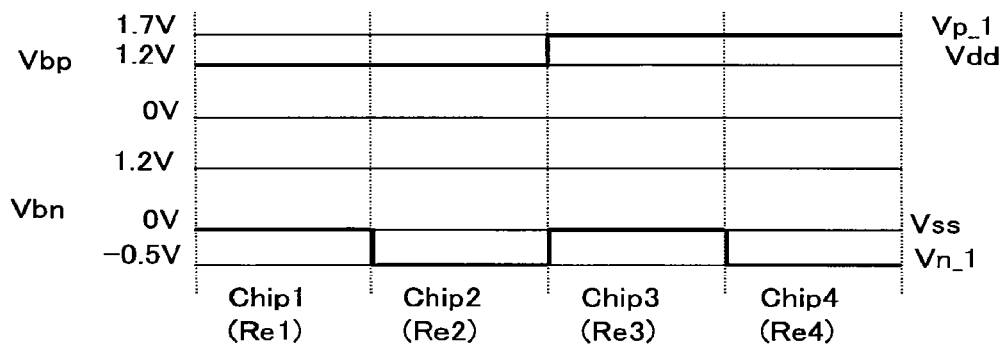
FIG. 4 is a diagram depicting body bias voltages applied to chips corresponding to regions adjacent to a limit line of a read operation and a limit line of a write operation in FIG. 2 depending on the level changes in the output signals of the control memories shown in FIG. 1.

FIG. 4 is a diagram showing body bias voltages Vbp and Vbn applied to chips 2, 3 and 4 corresponding to regions Re2, Re3 and Re4 adjacent to the limit line Lim_Rd of the read operation and the limit line Lim_Wr of the write operation in FIG. 2 depending on the level changes in the output signals Cnt_Sg1 and Cnt_Sg2 of the control memories Cnt_MM1 and Cnt_MM2. In a chip Chip1 corresponding to a region Re1 which is not close to the limit line Lim_Rd of the read operation and the limit line Lim_Wr of the write operation in FIG. 2, the threshold voltage Vth (N) of each NMOS and the absolute value |Vth (P)| of the threshold voltage of each PMOS are respectively set to proper values. Thus, the PMOS body bias voltage Vbp is set to the source voltage Vdd, and the NMOS body bias voltage Vbn is set to the ground voltage Vss in the chip Chip1 corresponding to the region Re1. In the chips Chip2 an Chip4 corresponding to the regions Re2 and Re4 adjacent to the limit line Lim_Rd of the read operation in FIG. 2, the threshold voltage Vth (N) of each NMOS assumes a state of a low threshold voltage. In these chips Chip2 and Chip4, the output signal Cnt_Sg2 of the control memory Cnt_MM2 is brought to a low level. Accordingly, the driver NMOSs Qn1 and Qn2 and transfer NMOSs Qn3 and Qn4 of each SRAM memory cell to which an NMOS body bias voltage Vbn of a level (0.5V) lower than the ground voltage Vss is applied, can be controlled from a low threshold voltage to a high threshold voltage Vth (N). In the chips Chip3 and Chip4 corresponding to the regions Re3 and Re4 close to the limit line Lim_Wr of the write operation in FIG. 2, the absolute value |Vth (P)| of the threshold voltage of each PMOS assumes a state of a low threshold voltage. In these chips Chip3 and Chip4, the output signal Cnt_Sg1 of the control memory Cnt_MM1 is brought to a low level. Accordingly, the load PMOSs Qp1 and Qp2 of each SRAM memory cell to which a PMOS body bias voltage Vbp of a level (1.7V) higher than the source voltage Vdd (1.2V) is applied, can be controlled from a low threshold voltage to a high threshold voltage |Vth (P)|.

Figure 5:
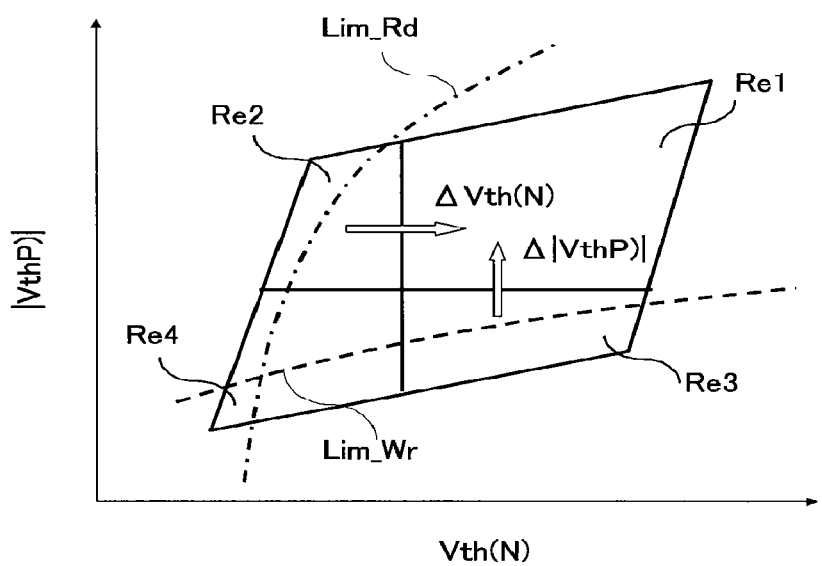
FIG. 5 is a diagram showing the manner in which the manufacturing yield of an MOSLSI is enhanced as a result of effective threshold voltages at the operations of the chips being respectively controlled to proper values by application of the body bias voltages to the chips each using the control memories and control switch described in FIG. 4.

FIG. 5 is a diagram showing the manner in which the manufacturing yield of an MOSLSI is enhanced from the result that effective threshold voltages at the operations of the chips are respectively controlled to proper values by application of the body bias voltages to the chips each using the control memories Cnt_MM1 and Cnt_MM2 and control switch Cnt_SW described in FIG. 4. In the chips Chip2 and Chip4 corresponding to the regions Re2 and Re4 close to the limit line Lim_Rd of the read operation in FIG. 2 as shown in the same figure, the threshold voltage Vth (N) of each NMOS effectively increases by ΔVth (N) after the start of their operations. Thus, all SRAM memory cells of the chips Chip2 and Chip4 are capable of normal read operation. In the chips Chip3 and Chip4 corresponding to the regions Re3 and Re4 close to the limit line Lim_Wr of the write operation in FIG. 2, the absolute value |Vth (P)| of the threshold voltage of each PMOS effectively increases by |Vth (P)| after the start of their operations. Accordingly, all SRAM memory cells of the chips Chip3 and Chip4 are capable of normal write operation.

<<Example of Control Memory>>

Figure 6A:
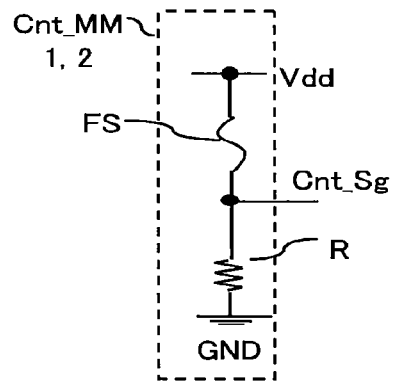
FIGS. 6(a) and 6(b) are circuit diagrams illustrating examples of configurations of the control memories in the chip of the LSI shown in FIG. 1.
Figure 6B:
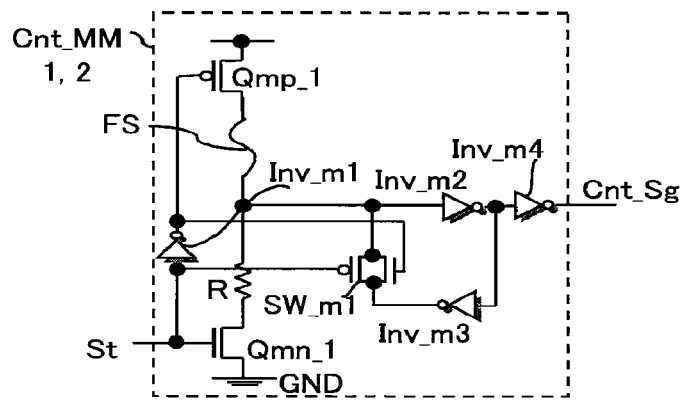

FIGS. 6(a) and 6(b) are circuit diagrams illustrating examples of configurations of the control memories Cnt_MM1 and Cnt_MM2 in the chip Chip of the LSI shown in FIG. 1. FIG. 6(a) shows the simplest control memories Cnt_MM1 and Cnt_MN2. Each of the control memories Cnt_MM1 and Cnt_MM2 comprises a fuse FS and a resistor R coupled in series between a source voltage Vdd and a ground voltage GND. FIG. 6(b) shows slightly-complicated control memories Cnt_MM1 and Cnt_MM2. Each of the control memories Cnt_MM1 and Cnt_MM2 comprises a PMOS Qmp_1, a fuse FS, a resistor R and an NMOS Qmn_1 coupled in series between a source voltage Vdd and a ground voltage GND, four inverters Inv_m1, . . . and Inv_m4, and a CMOS analog switch SW_m1. When the fuse FS of the control memories Cnt_MM1 and Cnt_MM2 shown in FIG. 6(a) is cut, a high source voltage Vdd for its cutting is applied to blow the fuse FS. When the fuse FS of the control memories Cnt_MMs shown in FIG. 6(b) is cut, a control signal St of a high level is applied and a high source voltage Vdd for its cutting is applied to blow the fuse FS. When the fuse FS is blown in the control memories Cnt_MM1 and Cnt_MM2 shown in FIG. 6(a), signals Cnt_Sg outputted from the control memories Cnt_MM1 and Cnt_MM2 at the early stage of the start of operation of the chip Chip of the subsequent LSI are brought to the ground voltage GND corresponding to a low level. If the fuse FS is not cut in a flow of FIG. 9 at the control memories Cnt_MM1 and Cnt_MM2 shown in FIG. 6(a) in reverse, then the output signals Cnt_Sg at the early stage of the start of operation of the chip Chip of the subsequent LSI are brought to the source voltage Vdd corresponding to a high level. When the fuse FS is cut even at the control memories Cnt_MM1 and Cnt_MM2 shown in FIG. 6(b), the latch output signals Cnt_Sg of the control memories Cnt_MM1 and Cnt_MM2 at the early stage of the start of operation of the chip are brought to the ground voltage GND corresponding to a low level in response to a high-level startup signal St. If the fuse FS is not cut at the control memories Cnt_MM1 and Cnt_MM2 shown in FIG. 6(b) in reverse, then the latch output signals Cnt_Sg at the early stage of the start of operation of the chip are brought to the source voltage Vdd corresponding to a high level in response to the high-level startup signal St.

<<Measurement of Threshold Voltage of SRAM Memory Cell>>

Figure 7:
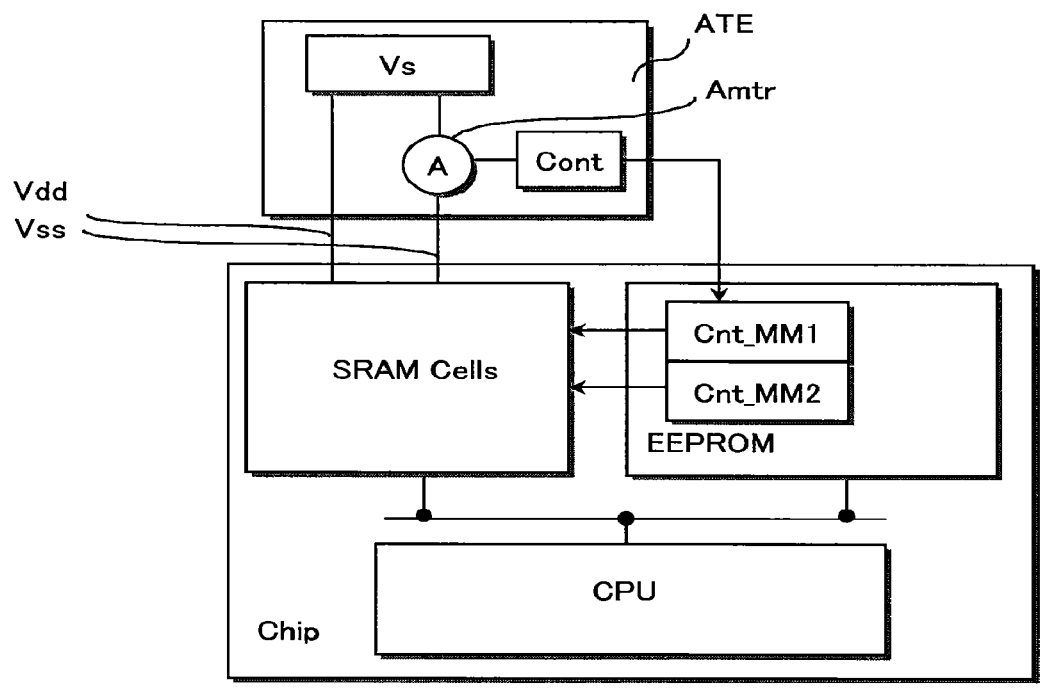
FIG. 7 is a diagram for describing measurements of threshold voltages of SRAM memory cells of a plurality of chips in the semiconductor integrated circuit according to the one embodiment of the present invention, which is disposed on a wafer.

FIG. 7 is a diagram for describing measurements of threshold voltages of SRAM memory cells of a plurality of chips Chips in the semiconductor integrated circuit according to the one embodiment of the present invention, which is disposed on a wafer. In the same figure, the chip Chip of the semiconductor integrated circuit shown in FIG. 1 includes an EEPROM used as a nonvolatile memory, and a central processing unit CPU in addition to an SRAM. The EEPROM used as the nonvolatile memory is constituted of a flash memory and includes control memories Cnt_MM1 and Cnt_MM2 for compensating for variations in the characteristics of the SRAM, which are extremely important in the one embodiment of the present invention.

An external tester ATE is coupled to the chip Chip of the semiconductor integrated circuit shown in FIG. 1. The external tester ATE includes a power supply Vs for supplying a source voltage Vdd and a ground voltage Vss to the chip Chip, an ampere meter Amtr for measuring current flowing through the chip Chip, and a control unit Cont for performing writing into the EEPROM of the chip Chip. The external tester ATE classifies one chip Chip into one of the four regions Re1, Re2, Re3 and Re4 from the value of the total leakage current of all SRAM memory cells, which flows through the ampere meter Amtr. NMOS low threshold voltage information is programmed into its corresponding control memory Cnt_MM1 of an EEPROM of a chip Chip classified into the region Re2. PMOS low threshold voltage information is programmed into its corresponding control memory Cnt_MM2 of an EEPROM of a chip Chip classified into the region Re3. NMOS low threshold voltage information and PMOS low threshold voltage information are respectively programmed into their corresponding control memories Cnt_MM1 and Cnt_MM2 of an EEPROM of a chip Chip classified into the region Re4.

FIG. 23 is a diagram for describing a semiconductor integrated circuit manufacturing method including a flow for a wafer test and a wafer process of the semiconductor integrated circuit shown in FIG. 1.

When the wafer test is first started at Step 91 of FIG. 23, a leakage current of each PMOS of a chip Chip in one LSI is measured by the external tester ATE shown in FIG. 7 pre-coupled to the source voltage Vdd and ground voltage Vss of the chip Chip of the LSI at Step 92 for current measurement of a load PMOS of each SRAM memory cell.

Next, a leakage current of each NMOS of the chip Chip in one LSI is measured by the external tester ATE shown in FIG. 7 pre-coupled to the source voltage Vdd and the ground voltage Vss of the chip Chip in the LSI at Step 93 for current measurement of a driver NMOS and a transfer NMOS of the SRAM memory cell.

At Step 94 for decision, the external tester ATE determines whether the leakage current of the PMOS measured at Step 92 is larger than a design target value. When it is determined by the external tester ATE that the leakage current measured at Step 94 is greater than the design target value, the threshold voltage Vth of a PMOS transistor of the SRAM memory cell of the chip Chip leads to the result that it is greatly lower than the design target value.

In order to change the threshold voltage Vth of the PMOS transistor of the SRAM memory cell from a low Vth to a high Vth in this case, the fuse FS used as the nonvolatile memory element of the control memory Cnt_MM1 shown in FIG. 1 is cut at the following Step 95 to apply a body bias to the PMOS transistor. When it is determined by the external tester ATE that the leakage current of the PMOS measured at Step 94 is smaller than the design target value in reverse, the threshold voltage Vth of the PMOS transistor of the SRAM memory cell of the chip Chip leads to the result that it is higher than the design target value. Since there is no need to change the PMOS transistor of the SRAM memory cell to the high Vth in this case, the flow proceeds to both processes of Step 92 for the measurement of the leakage current of a PMOS of an SRAM memory cell of a chip Chip of the following LSI, and Step 94 for its determination.

At Step 96 for decision, the external tester ATE determines whether the leakage current of the NMOS measured at Step 93 is greater than the design target value. When it is determined by the external tester ATE that the leakage current measured at Step 96 is greater than the design target value, the threshold voltage Vth of an NMOS transistor of the SRAM memory cell of the chip Chip leads to the result that it is greatly lower than the design target value. In order to change the threshold voltage Vth of the NMOS transistor of the SRAM memory cell from a low Vth to a high Vth in this case, the fuse FS used as the nonvolatile memory element of the control memory Cnt_MM2 shown in FIG. 1 is cut at the following Step 97 to apply a body bias to the NMOS transistor. When it is determined by the external tester ATE that the leakage current of the NMOS measured at Step 96 is smaller than the design target value in reverse, the threshold voltage Vth of the NMOS transistor of the SRAM memory cell of the SRAM memory cell of the chip Chip leads to the result that it is higher than the design target value. Since there is no need to change the NMOS transistor of the SRAM memory cell to the high Vth in this case, the flow proceeds to both processes of Step 93 for the measurement of the leakage current of an NMOS of an SRAM memory cell of a chip Chip of the following LSI, and Step 96 for its determination.

When the wafer test of the LSI including a large number of chips, which is shown in FIG. 23, is completed, the fuses FS of the respective control memories Cnt_MM1 and Cnt_MM2 of the large number of chips in one wafer are held in a cut or non-cut state.

<<More Suitable Measurement of Threshold Voltage of SRAM Memory Cell>>

Figure 8:
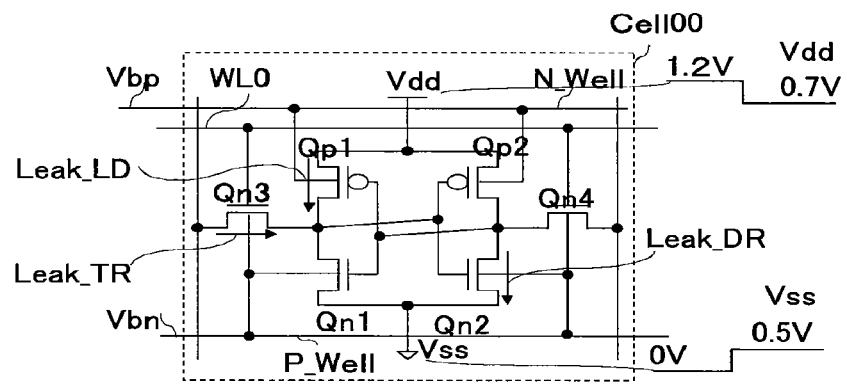
FIG. 8 is a diagram for describing paths of leakage currents flowing inside each SRAM memory cell in the chip of the semiconductor integrated circuit shown in FIG. 1.

FIG. 8 is a diagram for describing paths of leakage currents flowing inside the SRAM memory cell00 in the chip Chip of the semiconductor integrated circuit shown in FIG. 1. When the gate-to-source voltage of each MOS transistor is lower than the threshold voltage Vth, each leakage current is of a subthreshold leakage current that flows through its drain. First, a load leakage current leak_LD flows through the PMOS on the off side, of the load PMOSs Qp1 and Qp2, a transfer leakage current leak_TR flows through one of the transfer NMOSs Qn3 and Qn4, and a driver leakage current leak_DR flows through the NMOS on the off side, of the driver NMOSs Qn1 and Qn2. The magnitudes of these sub-threshold leakage currents become larger as the threshold voltage of the MOS transistor becomes smaller. The load leakage current leak_LD that flows through the PMOS on the off side, of the load PMOSs Qp1 and Qp2 becomes larger as the absolute value |Vth (2)| of the threshold voltage of the PMOS becomes smaller. The transfer leakage current leak_TR flowing through one of the transfer NMOSs Qn2 and Qn4, and the driver leakage current leak_DR flowing through the NMOS on the off side, of the driver NMOSs Qn1 and Qn2 become larger as the threshold voltage Vth (N) becomes smaller.

The values of the leakage currents leak_LD, leak_TR and leak_DR flowing inside the SRAM memory cell Cell00 shown in FIG. 8 have dependence complicated in response to the level of the source voltage Vdd and the level of the ground voltage Vss inside the SRAM memory cell.

Figure 9:
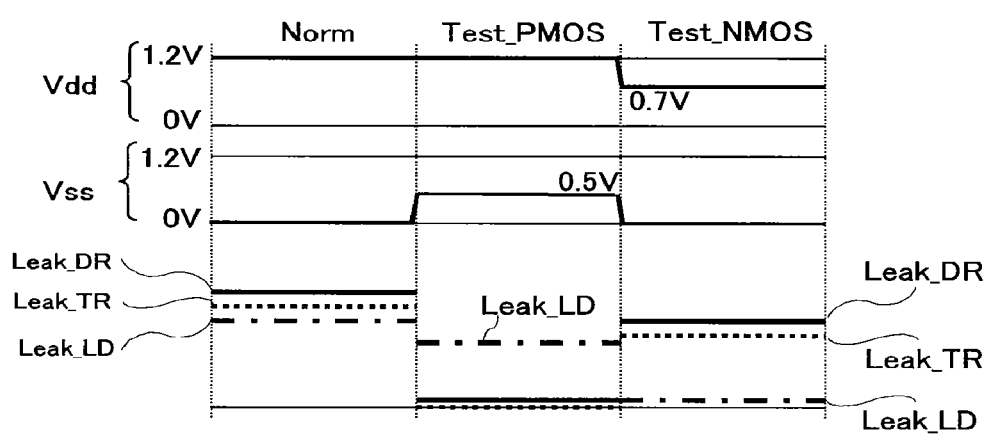
FIG. 9 is a diagram for describing dependence of the leakage currents flowing inside the SRAM memory cell in the chip of the semiconductor integrated circuit shown in FIG. 1 on an in-cell source voltage and a ground voltage Vss.
Figure 10:
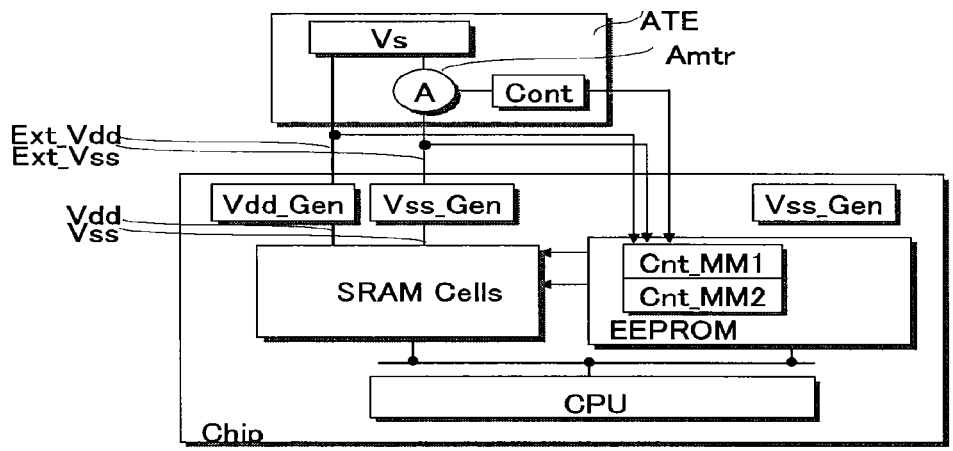
FIG. 10 is a diagram for describing a semiconductor integrated circuit according to one embodiment of the present invention, including an internal source voltage generator and an internal ground voltage generator both of which generate an internal source voltage and an internal ground voltage for each SRAM memory cell from an external source voltage and an external ground voltage.

FIG. 9 is a diagram for describing dependence of the leakage currents flowing inside the SRAM memory cell in the chip Chip of the semiconductor integrated circuit shown in FIG. 1 on the levels of the source voltage Vdd and ground voltage Vss inside the SRAM memory cell. FIG. 10 is a diagram for describing a semiconductor integrated circuit according to one embodiment of the present invention, including an internal source voltage generator Vdd_Gen and an internal ground voltage generator Vss_Gen both of which generate an internal source voltage Vdd and an internal ground voltage Vss for each SRAM memory cell from an external source voltage Ext_Vdd and an external ground voltage Ext_Vdd. In the left normal operating mode Norm shown in FIG. 9, the source voltage Vdd inside the SRAM memory cell is set to 1.2 volts, and the ground voltage Vss inside the SRAM memory cell is set to zero volts. In the normal operating mode Norm, leakage currents leak_LD, leak_TR and leak_DR corresponding to the absolute value |Vth (P)| of the threshold voltage of each PMOS and the threshold voltage Vth (N) of each NMOS flow.

During a measurement period Test_PMOS of the threshold voltage of the PMOS in the center of FIG. 9, the source voltage Vdd inside the SRAM memory cell is maintained at 1.2 volts, whereas the ground voltage Vss inside the SRAM memory cell rises from the zero volts to 0.5 volts by the internal ground voltage generator Vss_Gen. In contrast to this, the external ground voltage Vss set to the zero volts is applied to a P well P_Well for driver NMOSs Qn1 and Qn2 and transfer NMOSs Qn3 and Qn4 of the SRAM memory cell via an NMOS Qnc_1 of an NMOS controller N_Cnt provided outside an SRAM as an NMOS body bias voltage Vbn. Since the threshold voltages of the driver NMOSs Qn1 and Qn2 and transfer NMOSs Qn3 and Qn4 of the SRAM memory cell are respectively controlled to a high threshold voltage Vth (N) as a result thereof, the leakage currents leak_TR and leak_DR of the NMOS is reduced to a substantially negligible level. Thus, if the total leakage current of an SRAM memory cell array is measured during the measurement period Test_PMOS of the threshold voltage of the PMOS in the center of the same figure, then the total load leakage current leak_LD of load PMOSs Qp1 and Qp2 of the SRAM memory cell array can be measured.

Next, during a measurement period Test_NMOS of the threshold voltage of the NMOS on the right side of FIG. 9, the ground voltage Vss inside the SRAM memory cell is maintained at zero volts, whereas the source voltage Vdd inside the SRAM memory cell is lowered from 1.2 volts to 0.7 volts by the internal source voltage generator Vdd_Gen shown in FIG. 10. In contrast to this, the external source voltage Vdd set to 1.2 volts is applied to an N well N_Well for the load PMOSs Qp1 and Qp2 of the SRAM memory cell via an NMOS Qpc_1 of a PMOS controller P_Cnt provided outside the SRAM as a PMOS body bias voltage Vbp. Since the absolute values of the threshold voltages of the load PMOSs Qp1 and Qp2 of the SRAM memory cell are respectively controlled to a high threshold voltage |Vth (P)| as a result thereof, the leakage current leak_LD of the PMOS is reduced to a substantially negligible level. Thus, if the total leakage current of the SRAM memory cell array is measured during the measurement period Test_NMOS of the threshold voltage of the NMOS on the right side of the same figure, then current corresponding to the sum of the total driver leakage current leak_DR of the driver NMOSs Qn1 and Qn2 and the total transfer leakage current leak_TR of the transfer NMOSs Qn3 and Qn4 can be measured.

<<Layout of SRAM Memory Cell>>

Figure 11:
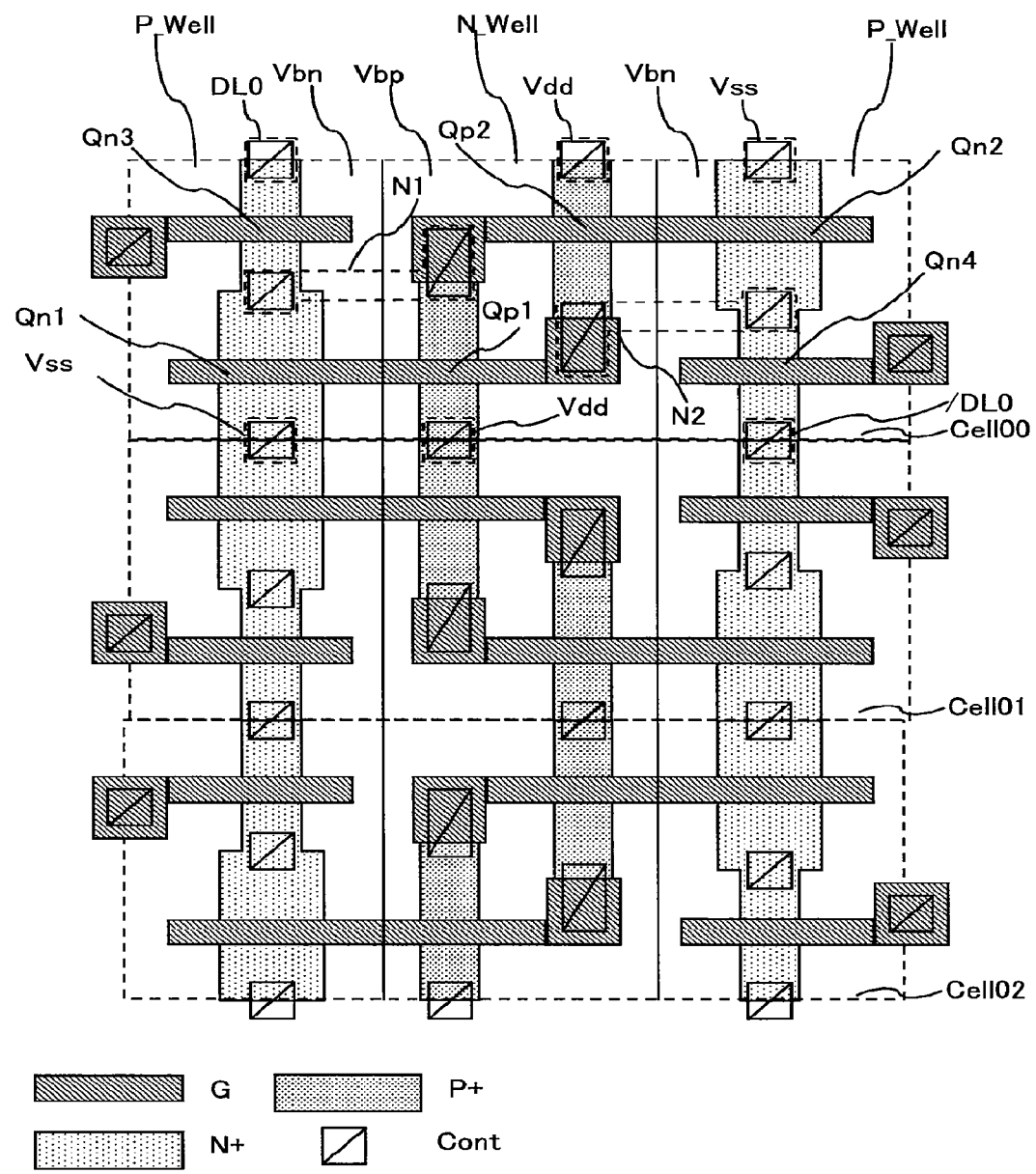
FIG. 11 is a layout diagram showing a device planar structure of the SRAM memory cells of the semiconductor integrated circuit shown in FIG. 1.

FIG. 11 is a layout diagram showing a device planar structure of the SRAM memory cells of the semiconductor integrated circuit shown in FIG. 1. Three SRAM memory cells Cell00, Cell01 and Cell02 are shown in FIG. 11. An N well N_Well is disposed in the center of FIG. 11. A pair of load PMOSs Qp1 and Qp2 of the SRAM memory cell Cell00 is disposed in the N well N_Well. One P well P_Well is disposed on the left side of FIG. 11. One driver NMOS Qn1 and one transfer NMOS Qn3 of the SRAM memory cell Cell00 are disposed in the one P well P_Well. The drain of the one load PMOS Qp1, the drain of the one driver NMOS Qn1, and the gate of the other load PMOS Qp2 are electrically coupled to a wiring area (broken line N1) used as one storage holding node N1. The other P well P_Well is disposed on the right side of FIG. 11. The driver NMOS Qn2 and the other transfer NMOS Qn4 of the SRAM memory cell Cell00 are disposed in the other P well P_Well. The drain of the other load PMOS Qp2, the drain of the other driver NMOS Qn2, and the gate of the one load PMOS Qp1 are electrically coupled to a wiring area (broken line N2) used as one storage holding node N2.

Figure 12:
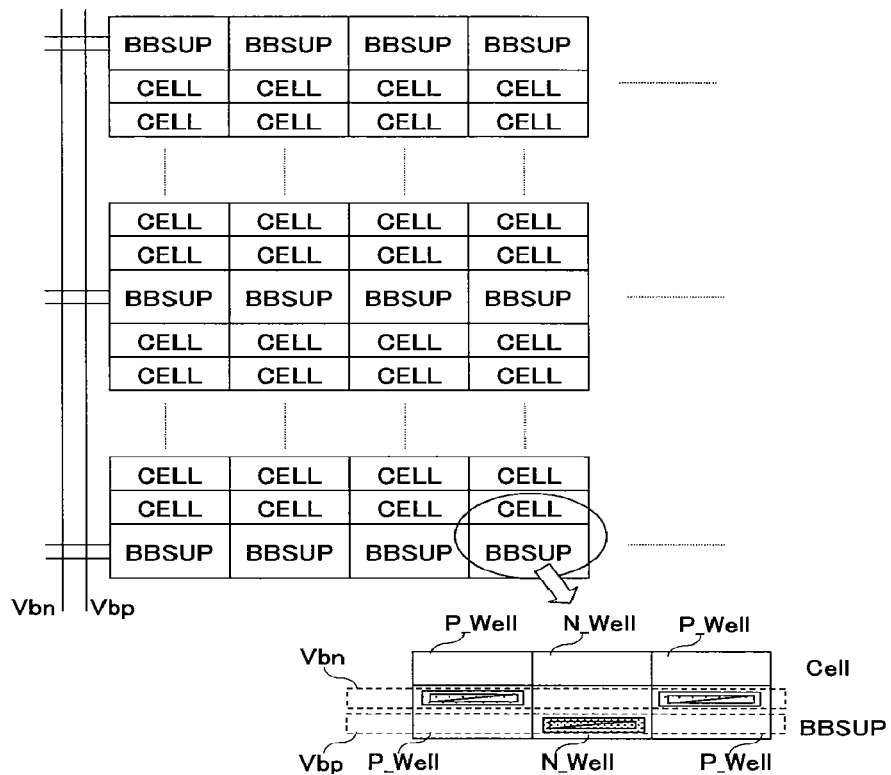
FIG. 12 is a diagram for describing the supply of a PMOS body bias voltage and an NMOS body bias voltage to N and P wells of each SRAM memory cell of the semiconductor integrated circuit shown in FIG. 11.

FIG. 12 is a diagram for describing the supply of a PMOS body bias voltage Vbp and an NMOS body bias voltage Vbn to N and P wells N_Well and P_Well of each SRAM memory cell of the semiconductor integrated circuit shown in FIG. 11. Metal wirings for supplying the PMOS body bias voltage Vbp and the NMOS body bias voltage Vbn are disposed vertically as viewed on the left side of FIG. 12. Body bias voltage supply cells BBSUPs are coupled to the metal wirings, and normal SRAM memory cells CELLs are coupled to the body bias voltage supply cells BBSUPs. The normal SRAM memory cells CELLs shown in FIG. 12 are configured in exactly the same as the SRAM memory cell Cell00 shown in FIG. 11.

Contacts are respectively formed in the central N wells N_Wells of the body bias voltage supply cells BBSUPs. Each of the central N wells N_Wells is electrically coupled to the PMOS body bias voltage Vbp (broken line) disposed in the horizontal direction via the contact. The central N well N_Well of the body bias voltage supply cell BBSUP and the central N well N_Well of the normal SRAM memory cell CELL are integrally configured. Thus, the PMOS body bias voltage Vbp can be supplied to the central N well N_Well of the normal SRAM memory cell CELL through the metal wiring on the left side of FIG. 12.

Contacts are respectively formed in the left P wells P_Wells of the body bias voltage supply cells BBSUPs. Each of the left P wells P_Wells is electrically coupled to the NMOS body bias voltage Vbn (broken line) disposed in the horizontal direction via the contact. The left P well P_Well of the body bias voltage supply cell BBSUP and the left P well P_Well of the normal SRAM memory cell CELL are integrally configured. Thus, the NMOS body bias voltage Vbn can be supplied to the left P well P_Well of the normal SRAM memory cell CELL through the metal wiring on the left side of FIG. 12.

Contacts are respectively formed in the right P wells P_Wells of the body bias voltage supply cells BBSUPs. Each of the right P wells P_Wells is electrically coupled to the NMOS body bias voltage Vbn (broken line) disposed in the horizontal direction via the contact. The right P well P_Well of the body bias voltage supply cell BBSUP and the right P well P_Well of the normal SRAM memory cell CELL are integrally configured. Thus, the NMOS body bias voltage Vbn can be supplied to the right P well P_Well of the normal SRAM memory cell CELL through the metal wiring on the left side of FIG. 12.

<<On-Chip Voltage Generating Section>>

Figure 13:
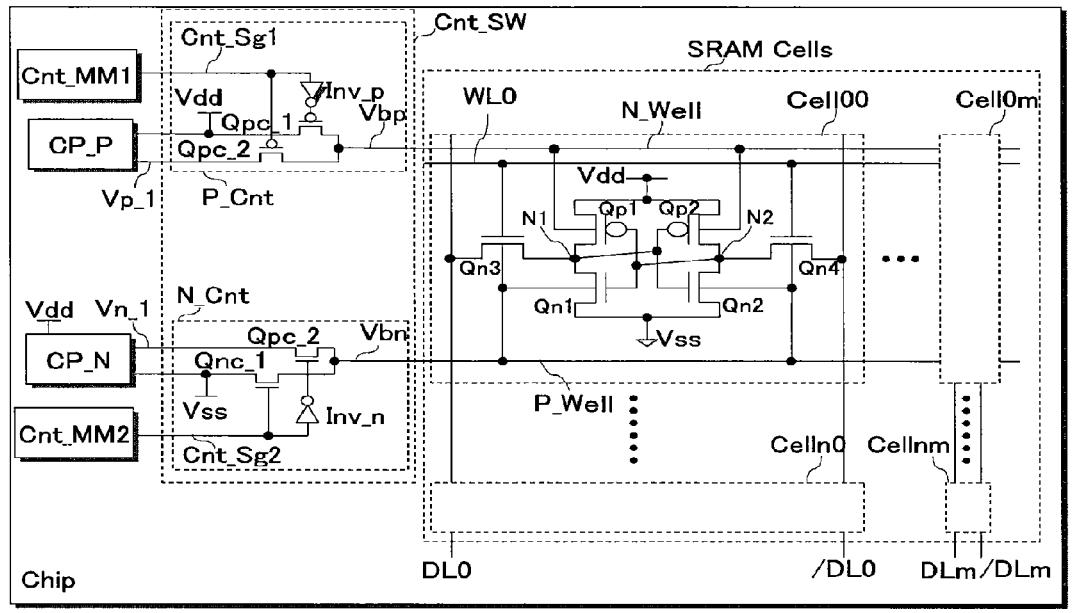
FIG. 13 is a circuit diagram illustrating a semiconductor integrated circuit according to another embodiment of the present invention.

FIG. 13 is a circuit diagram illustrating a semiconductor integrated circuit according to another embodiment of the present invention. The semiconductor integrated circuit shown in FIG. 13 is different from the semiconductor integrated circuit shown in FIG. 1 in that it includes a positive voltage generator CP_P and a negative voltage generator CP_N. The positive voltage generator CP_P forms an N well bias voltage Vp_1 higher than a source voltage Vdd in response to the supply of the source voltage Vdd. The generated high N well bias voltage Vp_1 can be supplied to an N well N_Well of load PMOSs Qp1 and Qp2 of each SRAM memory cell. The negative voltage generator CP_N forms a P well bias voltage Vn_1 lower than a ground voltage Vss in response to the supply of the ground voltage Vss. The generated low P well bias voltage Vn_1 can be supplied to a P well P_Well of driver NMOSs Qn1 and Qn2 and transfer NMOSs Qn3 and Qn4 of the SRAM memory cell. As a result, the semiconductor integrated circuit shown in FIG. 13 is capable of reducing the number of external terminals as compared with the semiconductor integrated circuit shown in FIG. 1. While each of the positive voltage generator CP_P and the negative voltage generator CP_N can be constituted of a charge pump circuit, it can be constructed even by a DC-DC converter such as a switching regulator or the like.

<<More Complicated Body Bias Voltage Control>>

Figure 14:
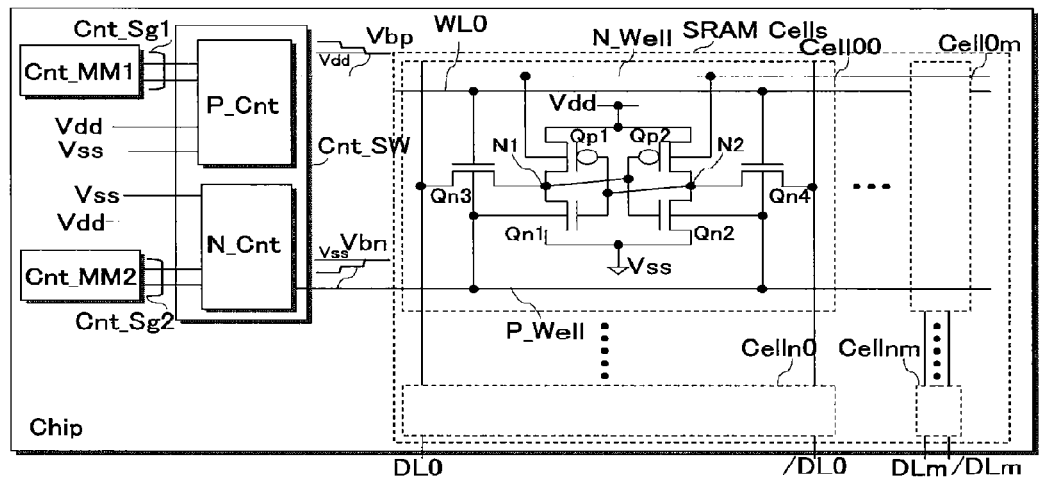
FIG. 14 is a circuit diagram depicting a semiconductor integrated circuit according to a further embodiment of the present invention.

FIG. 14 is a circuit diagram showing a semiconductor integrated circuit according to a further embodiment of the present invention. The semiconductor integrated circuit shown in FIG. 14 is different from the semiconductor integrated circuit shown in FIG. 1 in that whether well bias voltages Vp_1 and Vn_1 are applied to PMOSs and NMOSs of each SRAM memory cell can be set by control memories Cnt_MM1 and Cnt_MM2 independently. Output signals Cnt_Sgt and Cnt_Sg2 of the control memories Cnt_MM1 and Cnt_MM2 are constituted of plural bits. As a result, the well bias voltages Vp_1 and Vn_1 applied to the PMOSs and NMOSs of the SRAM memory cell are also represented in the form of multivalued voltages.

Figure 15A:
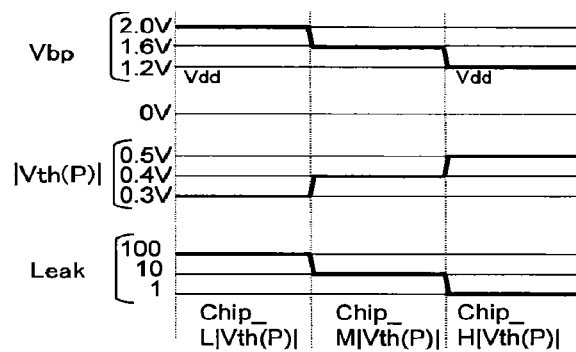
FIGS. 15(*a*) and 15(*b*) are diagrams showing the manner in which the values of a PMOS body bias voltage and an NMOS body bias voltage applied to a PMOS and an NMOS of each SRAM memory cell are controlled according to the values of threshold voltages of the PMOS and NMOS of each SRAM memory cell in the semiconductor integrated circuit shown in FIG. 14.
Figure 15B:
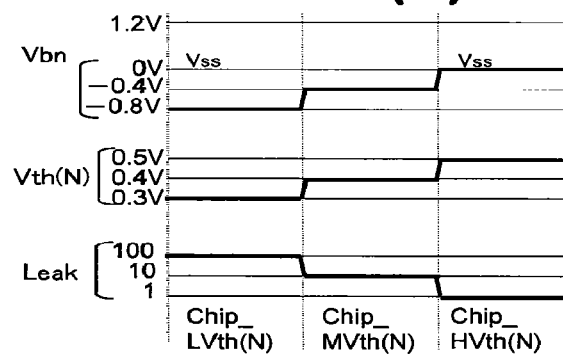

FIGS. 15(a) and 15(b) are diagrams showing the manner in which the values of a PMOS body bias voltage Vbp and an NMOS body bias voltage Vbn applied to PMOSs and NMOSs of each SRAM memory cell are controlled according to the values of threshold voltages of the PMOSs and NMOSs of the SRAM memory cell in the semiconductor integrated circuit shown in FIG. 14.

Figure 16A:
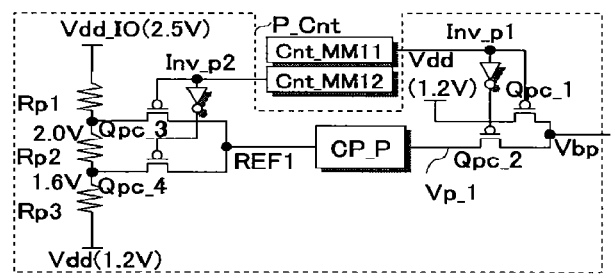
FIGS. 16(*a*) and 16(*b*) are diagrams illustrating configurations of a PMOS controller and an NMOS controller of a control switch of the semiconductor integrated circuit shown in FIG. 14.
Figure 16B:
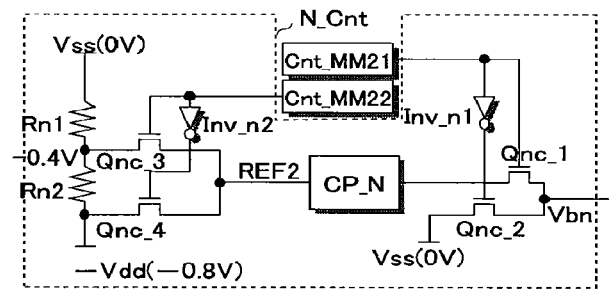

FIGS. 16(a) and 16(b) are diagrams illustrating configurations of a PMOS controller P_Cnt and an NMOS controller N_Cnt of a control switch Cnt_SW of the semiconductor integrated circuit shown in FIG. 14.

As shown in FIG. 16(a), the PMOS controller P_Cnt of the control switch Cnt_SW is controlled by control memories Cnt_MM11 and Cnt_MM12 that constitute the control memory Cnt_MM1. As shown in FIG. 16(b), the NMOS controller N_Cnt of the control switch Cnt_SW is controlled by control memories Cnt_MM21 and Cnt_MM22 that constitute the control memory Cnt_MM2 of FIG. 14. As shown in FIG. 16(a), the PMOS controller P_Cnt includes PMOSs Qpc_1, Qpc_2, Qpc_3 and Qpc_4 controlled by the control memories Cnt_MM11 and Cnt_MM12. The PMOS controller P_Cnt includes a positive voltage generator CP_P, inverters Inv_p1 and Inv_p2 and voltage division resistors Rp1, Rp2 and Rp3. 2.5 volts corresponding to an input/output unit source voltage Vdd TO for the semiconductor integrated circuit is supplied to one end of the voltage division resistor Rp1, and 1.2 volts corresponding to a source voltage Vdd for each SRAM memory cell is supplied to the other end of the voltage division resistor Rp3. As shown in FIG. 16(b), the NMOS controller N_Cnt includes NMOSs Qnc_1, Qnc_2, Qnc_3 and Qnc_4 controlled by the control memories Cnt_MM21 and Cnt_MM22. The NMOS controller N_Cnt includes a negative voltage generator CP_N, inverters Inv_n1 and Inv_n2, and voltage division resistors Rn1 and Rn2. One end of the voltage division resistor Rn1 is supplied with zero volts corresponding to a ground voltage Vss, and the other end of the voltage division resistor Rn2 is supplied with −0.8 volts corresponding to a negative source voltage Vdd.

Assume that it is determined by the measurements of the threshold voltages of each SRAM memory cell such as described in FIG. 7 that the absolute values |Vth (2)| of the threshold voltages of the PMOSs Qp1 and Qp2 of each SRAM memory cell of the semiconductor integrated circuit shown in FIG. 14 are approximately 0.3 volts. When the absolute value |Vth (P)| of the threshold voltage of each PMOS is approximately 0.3 volts, leakage current of the PMOS is brought to an extremely large state indicative of 100. In order to reduce the extremely large leakage current of the PMOS, "1" is programmed into the control memory Cnt_MM11 on a nonvolatile basis, and "0" is programmed into the control memory Cnt_MM12 on a nonvolatile basis. Assume that it is determined by the measurements of the threshold voltages of each SRAM memory cell such as described in FIG. 7 that the threshold voltages Vth (N) of the NMOSs Qn1, Qn2, Qn3 and Qn4 of each SRAM memory cell of the semiconductor integrated circuit shown in FIG. 14 are respectively approximately 0.3 volts. When the threshold voltage Vth (N) of each NMOS is approximately 0.3 volts, leakage current of the NMOS is brought to an extremely large state indicative of 100. In order to reduce the extremely large leakage current of the NMOS, "1" is programmed into the control memory Cnt_MM21 on a nonvolatile basis, and "0" is programmed into the control memory Cnt_MM22 on a nonvolatile basis.

In doing so, the PMOSs Qpc_1, Qpc_2, Qpc_3 and Qpc_4 of the PMOS controller P_Cnt shown in FIG. 16(a) are respectively controlled to off, on, on and off. A division voltage corresponding to 2.0 volts between the voltage division resistors Rp1 and Rp2 is supplied to the input of the positive voltage generator CP_P via the PMOS Qpc_3. The voltage of 2.0 volts corresponding to the output of the positive voltage generator CP_P is obtained as the PMOS body bias voltage Vbp supplied to the corresponding N well of the load PMOSs Qp1 and Qp2 of the SRAM memory cell via the PMOS Qpc_2. Since the source voltage Vdd of 1.2 volts is applied to the sources of the load PMOSs Qp1 and Qp2 of the SRAM memory cell, the load PMOSs Qp1 and Qp2 are respectively controlled to a low leak state at a high threshold voltage.

The NMOSs Qnc_1, Qnc_2, Qnc_3 and Qnc_4 of the NMOS controller N_Cnt shown in FIG. 16(b) are respectively controlled to on, off, off and on. The voltage of −0.8 volts corresponding to a negative source voltage Vdd is supplied to the input of the negative voltage generator CP_N via the NMOS Qnc_4. The voltage of −0.8 volts corresponding to the output of the negative voltage generator CP_N is obtained as the NMOS body bias voltage Vbn supplied to the corresponding P well of the driver NMOSs Qn1 and Qn2 and transfer NMOSs Qn3 and Qn4 of the SRAM memory cell via the NMOS Qnc_1. Since the ground voltage Vss of 0 volts is applied to the sources of the driver NMOSs Qn1 and Qn2 and transfer NMOSs Qn3 and Qn4 of the SRAM memory cell, the driver NMOSs Qn1 and Qn2 and transfer NMOSs Qn3 and Qn4 are respectively controlled to a low leak state at a high threshold voltage.

Assume that it is determined by the measurements of the threshold voltages of each SRAM memory cell such as described in FIG. 7 that the absolute values |Vth (P)| of the threshold voltages of the PMOSs Qp1 and Qp2 of each SRAM memory cell of the semiconductor integrated circuit shown in FIG. 14 are approximately 0.4 volts. When the absolute value |Vth (P)| of the threshold voltage of each PMOS is approximately 0.4 volts, leakage current of the PMOS is brought to a relatively large state indicative of 10. In order to reduce the relatively large leakage current of the PMOS, "1" is programmed into the control memory Cnt_MM11 on a nonvolatile basis, and "1" is programmed into the control memory Cnt_MM12 on a nonvolatile basis. Assume that it is determined by the measurements of the threshold voltages of each SRAM memory cell such as described in FIG. 7 that the threshold voltages Vth (N) of the NMOSs Qn1, Qn2, Qn3 and Qn4 of each SRAM memory cell of the semiconductor integrated circuit shown in FIG. 14 are respectively approximately 0.4 volts. When the threshold voltage Vth (N) of each NMOS is approximately 0.4 volts, leakage current of the NMOS is brought to a relatively large state indicative of 10. In order to reduce the relatively large leakage current of the NMOS, "1" is programmed into the control memory Cnt_MM21 on a nonvolatile basis, and "1" is programmed into the control memory Cnt_MM22 on a nonvolatile basis.

In doing so, the PMOSs Qpc_1, Qpc_2, Qpc_3 and Qpc_4 of the PMOS controller P_Cnt shown in FIG. 16(a) are respectively controlled to off, on, off and on. A division voltage corresponding to 1.6 volts between the voltage division resistors Rp2 and Rp3 is supplied to the input of the positive voltage generator CP_P via the PMOS Qpc_4. The voltage of 1.6 volts corresponding to the output of the positive voltage generator CP_P is obtained as the PMOS body bias voltage Vbp supplied to the corresponding N well of the load PMOSs Qp1 and Qp2 of the SRAM memory cell via the PMOS Qpc_2. Since the source voltage Vdd of 1.2 volts is applied to the sources of the load PMOSs Qp1 and Qp2 of the SRAM memory cell, the load PMOSs Qp1 and Qp2 are respectively controlled to a relatively low leak state at a relatively high threshold voltage.

The NMOSs Qnc_1, Qnc_2, Qnc_3 and Qnc_4 of the NMOS controller N_Cnt shown in FIG. 16(b) are respectively controlled to on, off, on and off. The voltage of −0.4 volts corresponding to a negative voltage between the voltage division resistors Rn1 and Rn2 is supplied to the input of the negative voltage generator CP_N via the NMOS Qnc_3. The voltage of −0.4 volts corresponding to the output of the negative voltage generator CP_N is obtained as the NMOS body bias voltage Vbn supplied to the corresponding P well of the driver NMOSs Qn1 and Qn2 and transfer NMOSs Qn3 and Qn4 of the SRAM memory cell via the NMOS Qnc_1. Since the ground voltage Vss of 0 volts is applied to the sources of the driver NMOSs Qn1 and Qn2 and transfer NMOSs Qn3 and Qn4 of the SRAM memory cell, the driver NMOSs Qn1 and Qn2 and transfer NMOSs Qn3 and Qn4 are respectively controlled to a relatively low leak state at a relatively high threshold voltage.

Assume that it is determined by the measurements of the threshold voltages of each SRAM memory cell such as described in FIG. 7 that the absolute values |Vth (P)| of the threshold voltages of the PMOSs Qp1 and Qp2 of each SRAM memory cell of the semiconductor integrated circuit shown in FIG. 14 are approximately 0.5 volts. When the absolute value |Vth (P)| of the threshold voltage of each PMOS is approximately 0.5 volts, leakage current of the PMOS is brought to a small state indicative of 1. At this time, "0" is programmed into the control memory Cnt_MM11 on a nonvolatile basis. Assume that it is determined by the measurements of the threshold voltages of each SRAM memory cell such as described in FIG. 7 that the threshold voltages Vth (N) of the NMOSs Qn1, Qn2, Qn3 and Qn4 of each SRAM memory cell of the semiconductor integrated circuit shown in FIG. 14 are respectively approximately 0.5 volts. When the threshold voltage Vth (N) of each NMOS is approximately 0.5 volts, leakage current of the NMOS is brought to a small state indicative of 1. At this time, "0" is programmed into the control memory Cnt_MM21 on a nonvolatile basis.

In doing so, the PMOSs Qpc_1 and Qpc_2 of the PMOS controller P_Cnt shown in FIG. 16(a) are respectively controlled to on and off. Since the source voltage Vdd of 1.2 volts is obtained as the PMOS body bias voltage Vbp supplied to the corresponding N well of the load PMOSs Qp1 and Qp2 of the SRAM memory cell via the PMOS Qpc_1. Since the source voltage Vdd of 1.2 volts is applied to the sources of the load PMOSs Qp1 and Qp2 of the SRAM memory cell, no body bias voltage is applied to the load PMOSs Qp1 and Qp2.

The NMOSs Qnc_1 and Qnc_2 of the NMOS controller N_Cnt shown in FIG. 16(b) are respectively controlled to off and on. The ground voltage Vss of 0 volts is obtained as the NMOS body bias voltage Vbn supplied to the corresponding P well of the driver NMOSs Qn1 and Qn2 and transfer NMOSs Qn3 and Qn4 of the SRAM memory cell via the NMOS Qnc_2. Since the ground voltage Vss of 0 volts is applied to the sources of the driver NMOSs Qn1 and Qn2 and transfer NMOSs Qn3 and Qn4 of the SRAM memory cell, no body bias voltage is applied to the driver NMOSs Qn1 and Qn2 and transfer NMOSs Qn3 and Qn4.

<<Control on Body Bias Voltage of Forward Body Bias>>

Figure 17:
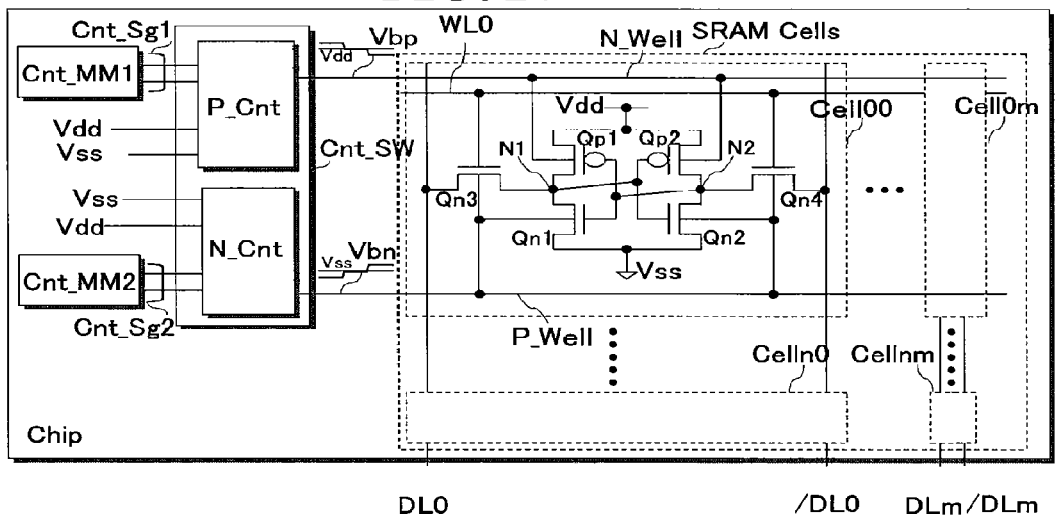
FIG. 17 is a circuit diagram showing a semiconductor integrated circuit according to a still further embodiment of the present invention.

FIG. 17 is a circuit diagram showing a semiconductor integrated circuit according to a still further embodiment of the present invention. The semiconductor integrated circuit shown in FIG. 17 is different from the semiconductor integrated circuit shown in FIG. 14 in that when it is determined that the threshold voltages of PMOSs and NMOSs of each SRAM memory cell are high, a body bias voltage of forward body bias is applied to change a high threshold voltage to a low threshold voltage.

Figure 18A:
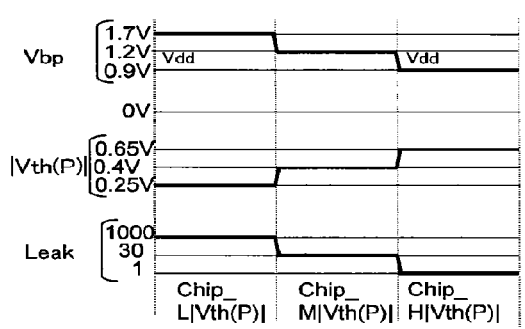
FIGS. 18(*a*) and 18(*b*) are diagrams illustrating the manner in which the values of a PMOS body bias voltage and an NMOS body bias voltage applied to a PMOS and an NMOS of each SRAM memory cell are controlled according to the values of threshold voltages of the PMOS and NMOS of each SRAM memory cell in the semiconductor integrated circuit shown in FIG. 17.
Figure 18B:
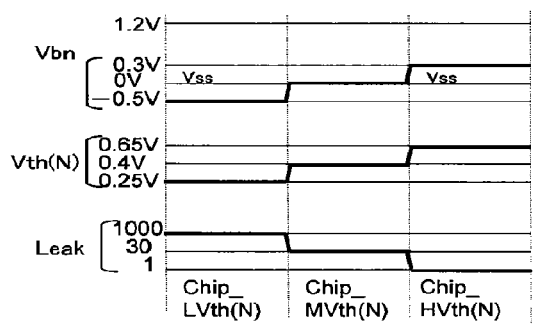

FIGS. 18(a) and 18(b) are diagrams illustrating the manner in which the values of a PMOS body bias voltage Vbp and an NMOS body bias voltage Vbn applied to PMOSs and NMOSs of each SRAM memory cell are controlled according to the values of the threshold voltages of the PMOSs and NMOSs of each SRAM memory cell in the semiconductor integrated circuit shown in FIG. 17.

Figure 19A:
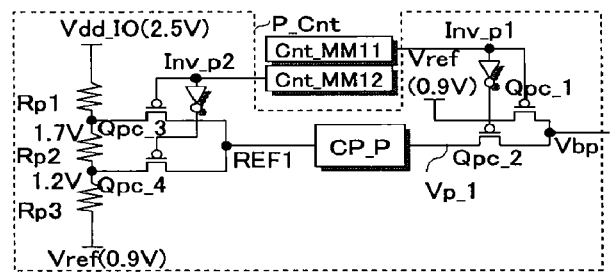
FIGS. 19(*a*) and 19(*b*) are diagrams showing configurations of a PMOS controller and an NMOS controller of a control switch of the semiconductor integrated circuit shown in FIG. 17.
Figure 19B:
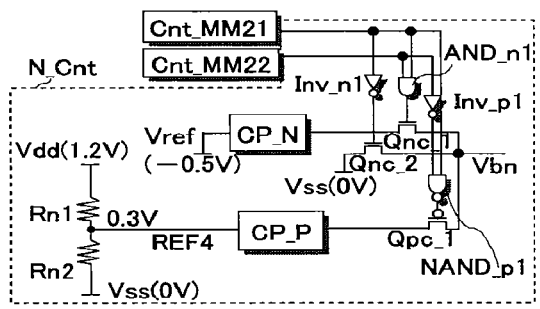

FIGS. 19(a) and 19(b) are diagrams showing configurations of a PMOS controller P_Cnt and an NMOS controller N_Cnt of a control switch Cnt_SW of the semiconductor integrated circuit shown in FIG. 17.

As shown in FIG. 19(a), the PMOS controller P_Cnt of the control switch Cnt_SW is controlled by control memories Cnt_MM11 and Cnt_MM12 shown in FIG. 17. As shown in FIG. 19(b), the NMOS controller N_Cnt of the control switch Cnt_SW is controlled by control memories Cnt_MM21 and Cnt_MM22 shown in FIG. 17. As shown in FIG. 19(a), the PMOS controller P_Cnt includes PMOSs Qpc_1, Qpc_2, Qpc_3 and Qpc_4 controlled by the control memories Cnt_MM11 and Cnt_MM12. The PMOS controller P_Cnt includes a positive voltage generator CP_P, inverters Inv_p1 and Inv_p2 and voltage division resistors Rp1, Rp2 and Rp3. 2.5 volts corresponding to an input/output unit source voltage Vdd_IO for the semiconductor integrated circuit are supplied to one end of the voltage division resistor Rp1, and 0.9 volts corresponding to a reference voltage Vref for each SRAM memory cell are supplied to the other end of the voltage division resistor Rp3. As shown in FIG. 19(b), the NMOS controller N_Cnt includes NMOSs Qnc_1 and Qnc_2 and a PMOS Qpc_1 controlled by the control memories Cnt_MM21 and Cnt_MM22. The NMOS controller N_Cnt includes a negative voltage generator CP_N, a positive voltage generator CP_P, inverters Inv_n1 and Inv_p1, an AND circuit AND_n1, a NAND circuit NAND_n1, and voltage division resistors Rn1 and Rn2. One end of the voltage division resistor Rn1 is supplied with 1.2 volts corresponding to a source voltage Vdd, and the other end of the voltage division resistor Rn2 is supplied with 0 volts corresponding to a ground voltage Vss.

Assume that it is determined by the measurements of the threshold voltages of each SRAM memory cell such as described in FIG. 7 that the absolute values |Vth (P)| of the threshold voltages of the PMOSs Qp1 and Qp2 of each SRAM memory cell of the semiconductor integrated circuit shown in FIG. 17 are approximately 0.25 volts. When the absolute value |Vth (P)| of the threshold voltage of each PMOS is approximately 0.25 volts, leakage current of the PMOS at a low threshold voltage is brought to an extremely large state indicative of 1000. In order to reduce the extremely large leakage current of the PMOS, "1" is programmed into the control memory Cnt_MM11 on a nonvolatile basis, and "0" is programmed into the control memory Cnt_MM12 on a nonvolatile basis. Assume that it is determined by the measurements of the threshold voltages of each SRAM memory cell such as described in FIG. 7 that the threshold voltages Vth (N) of the NMOSs Qn1, Qn2, Qn3 and Qn4 of each SRAM memory cell of the semiconductor integrated circuit shown in FIG. 17 are respectively approximately 0.25 volts. When the threshold voltage Vth (N) of each NMOS is approximately 0.25 volts, leakage current of the NMOS at a low threshold voltage is brought to an extremely large state indicative of 1000. In order to reduce the extremely large leakage current of the NMOS, "1" is programmed into the control memory Cnt_MM21 on a nonvolatile basis, and "1" is programmed into the control memory Cnt_MM22 on a nonvolatile basis.

In doing so, the PMOSs Qpc_1, Qpc_2, Qpc_3 and Qpc_4 of the PMOS controller P_Cnt shown in FIG. 19(a) are respectively controlled to off, on, on and off. A division voltage corresponding to 1.7 volts between the voltage division resistors Rp1 and Rp2 is supplied to the input of the positive voltage generator CP_P via the PMOS Qpc_3. The voltage of 1.7 volts corresponding to the output of the positive voltage generator CP_P is obtained as the PMOS body bias voltage Vbp supplied to the corresponding N well of the load PMOSs Qp1 and Qp2 of the SRAM memory cell via the PMOS Qpc_2. Since the source voltage Vdd of 1.2 volts is applied to the sources of the load PMOSs Qp1 and Qp2 of the SRAM memory cell, the load PMOSs Qp1 and Qp2 are respectively controlled to a low leak state at a high threshold voltage.

The NMOSs Qnc_1, Qnc_2, Qnc_3 and Qnc_4 of the NMOS controller N_Cnt shown in FIG. 19(b) are respectively controlled to on, off and off. The voltage of −0.5 volts corresponding to a negative reference voltage Vref is obtained as the NMOS body bias voltage Vbn supplied to the corresponding P well of the driver NMOSs Qn1 and Qn2 and transfer NMOSs Qn3 and Qn4 of the SRAM memory cell via the NMOS Qnc_1. Since the ground voltage Vss of 0 volts is applied to the sources of the driver NMOSs Qn1 and Qn2 and transfer NMOSs Qn3 and Qn4 of the SRAM memory cell, the driver NMOSs Qn1 and Qn2 and transfer NMOSs Qn3 and Qn4 are respectively controlled to a low leak state at a high threshold voltage.

Assume that it is determined by the measurements of the threshold voltages of each SRAM memory cell such as described in FIG. 7 that the absolute values |Vth (P)| of the threshold voltages of the PMOSs Qp1 and Qp2 of each SRAM memory cell of the semiconductor integrated circuit shown in FIG. 17 are a relatively high threshold voltage of approximately 0.4 volts. When the absolute value |Vth (P)| of the threshold voltage of each PMOS is of the relatively high threshold voltage of approximately 0.4 volts, leakage current of the PMOS at the relatively high threshold voltage is brought to a relatively small state indicative of 30. At this time, "1" is programmed into the control memory Cnt_MM11 on a nonvolatile basis, and "1" is programmed into the control memory Cnt_MM12 on a nonvolatile basis. Assume that it is determined by the measurements of the threshold voltages of each SRAM memory cell such as described in FIG. 7 that the threshold voltages Vth (N) of the NMOSs Qn1, Qn2, Qn3 and Qn4 of each SRAM memory cell of the semiconductor integrated circuit shown in FIG. 17 are respectively a relatively high threshold voltage of approximately 0.4 volts. When the threshold voltage Vth (N) of each NMOS is of the relatively high threshold voltage of approximately 0.4 volts, leakage current of the NMOS at the relatively high threshold voltage is brought to a relatively small state indicative of 30. At this time, "0" is programmed into the control memory Cnt_MM21 on a nonvolatile basis, and "1" is programmed into the control memory Cnt_MM22 on a nonvolatile basis.

In doing so, the PMOSs Qpc_1, Qpc_2, Qpc_3 and Qpc_4 of the PMOS controller P_Cnt shown in FIG. 19(a) are respectively controlled to off, on, off and on. A division voltage corresponding to 1.2 volts between the voltage division resistors Rp2 and Rp3 is supplied to the input of the positive voltage generator CP_P via the PMOS Qpc_4. The voltage of 1.2 volts corresponding to the output of the positive voltage generator CP_P is obtained as the PMOS body bias voltage Vbp supplied to the corresponding N well of the load PMOSs Qp1 and Qp2 of the SRAM memory cell via the PMOS Qpc_2. Since the source voltage Vdd of 1.2 volts is applied to the sources of the load PMOSs Qp1 and Qp2 of the SRAM memory cell, no body bias voltage is applied to the load PMOSs Qp1 and Qp2.

The NMOSs Qnc_1 and Qnc_2 and PMOS Qpc1 of the NMOS controller N_Cnt shown in FIG. 19(b) are respectively controlled to off, on and off. The ground voltage of 0 volts is obtained as the NMOS body bias voltage Vbn supplied to the corresponding P well of the driver NMOSs Qn1 and Qn2 and transfer NMOSs Qn3 and Qn4 of the SRAM memory cell via the NMOS Qnc_2. Since the ground voltage Vss of 0 volts is applied to the sources of the driver NMOSs Qn1 and Qn2 and transfer NMOSs Qn3 and Qn4 of the SRAM memory cell, no body bias voltage is applied to the driver NMOSs Qn1 and Qn2 and transfer NMOSs Qn3 and Qn4.

Assume that it is determined by the measurements of the threshold voltages of each SRAM memory cell such as described in FIG. 7 that the absolute values |Vth (P)| of the threshold voltages of the PMOSs Qp1 and Qp2 of each SRAM memory cell of the semiconductor integrated circuit shown in FIG. 17 are a high threshold voltage of approximately 0.5 volts. When the absolute value |Vth (P)| of the threshold voltage of each PMOS is of the high threshold voltage of approximately 0.5 volts, leakage current of the PMOS at the high threshold voltage is brought to a small state indicative of 1. At this time, "0" is programmed into the control memory Cnt_MM11 on a nonvolatile basis. Assume that it is determined by the measurements of the threshold voltages of each SRAM memory cell such as described in FIG. 7 that the threshold voltages Vth (N) of the NMOSs Qn1, Qn2, Qn3 and Qn4 of each SRAM memory cell of the semiconductor integrated circuit shown in FIG. 17 are respectively a high threshold voltage of approximately 0.5 volts. When the threshold voltage Vth (N) of each NMOS is of the high threshold voltage of approximately 0.5 volts, leakage current of the NMOS is brought to a small state indicative of 1. At this time, "1" is programmed into the control memory Cnt_MM21 on a nonvolatile basis, and "0" is programmed into the control memory Cnt_MM22.

In doing so, the PMOSs Qpc_1 and Qpc_2 of the PMOS controller P_Cnt shown in FIG. 19(a) are respectively controlled to on and off. A reference voltage Vref of 0.9 volts is obtained as the PMOS body bias voltage Vbp supplied to the corresponding N well of the load PMOSs Qp1 and Qp2 of the SRAM memory cell via the PMOS Qpc_1. Since the source voltage Vdd of 1.2 volts is applied to the sources of the load PMOSs Qp1 and Qp2 of the SRAM memory cell, a body bias voltage of forward body bias is applied to the corresponding N well of the load PMOSs Qp1 and Qp2. As a result, the load PMOS Qp1 and Qp2 are controlled from a high threshold voltage to a low threshold voltage.

The NMOSs Qnc_1 and Qnc_2 and PMOS Qpc_1 of the NMOS controller N_Cnt shown in FIG. 19(b) are respectively controlled to off, off and on. A division voltage of 0.3 volts between the voltage division resistors Rn1 and Rn2 is supplied to the input of the positive voltage generator CP_P. The voltage of 0.3 volts corresponding to the output of the positive voltage generator CP_P is obtained as the PMOS body bias voltage Vbp supplied to the corresponding N well of the load PMOSs Qp1 and Qp2 of the SRAM memory cell via the PMOS Qpc_1. Since the ground voltage Vss of 0 volts is applied to the sources of the driver NMOSs Qn1 and Qn2 and transfer NMOSs Qn3 and Qn4 of the SRAM memory cell, a body bias voltage of forward body bias is applied to the corresponding P well of the driver NMOSs Qn1 and Qn2 and transfer NMOSs Qn3 and Qn4. As a result, the driver NMOSs Qn1 and Qn2 and transfer NMOSs Qn3 and Qn4 are controlled from a high threshold voltage to a low threshold voltage.

<<Leakage Current Measurement of on Chip and Compensation for Variation with Time>>

Figure 20:
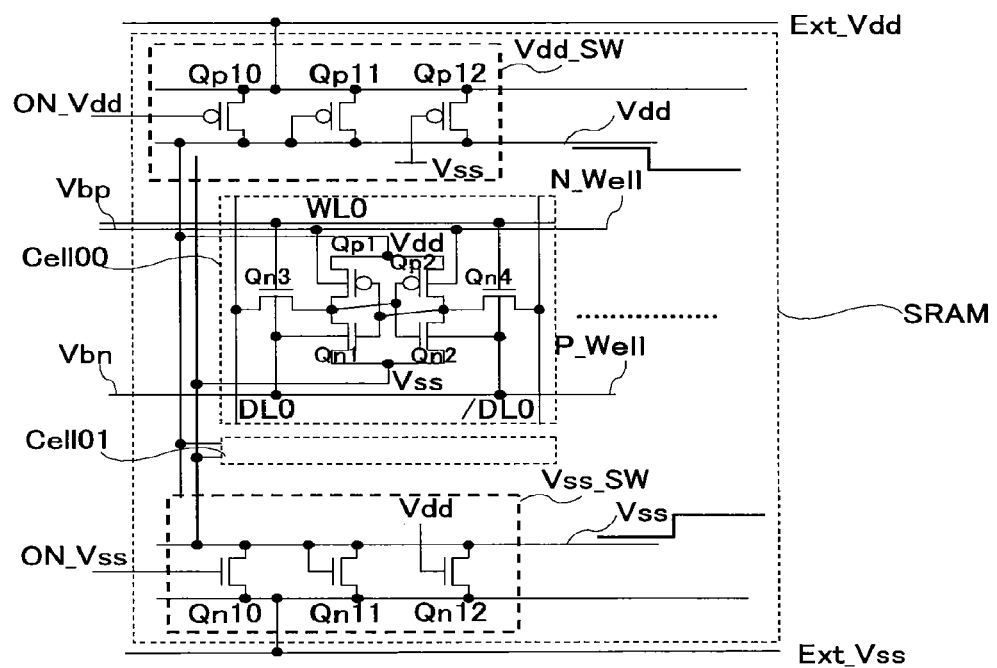
FIG. 20 is a circuit diagram depicting a semiconductor integrated circuit according to a still further embodiment of the present invention.
Figure 21:
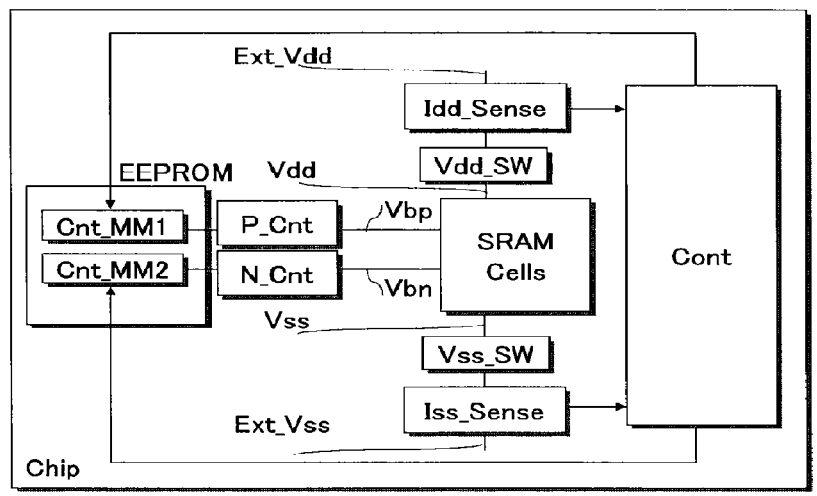
FIG. 21 is a circuit diagram showing a semiconductor integrated circuit according to a still further embodiment of the present invention.

FIGS. 20 and 21 are respectively circuit diagrams showing a semiconductor integrated circuit according to a still further embodiment of the present invention. A chip of MOSLSI shown in each of FIGS. 20 and 21 enables the measurements of leakage currents of PMOSs and NMOSs of each SRAM memory cell on-chip basis. In the chip of the MOSLSI shown in each of FIGS. 20 and 21, the leakage currents of the PMOSs and NMOSs of the SRAM memory cell are measured at a wafer manufacturing stage. Nonvolatile programs are effected on control memories Cnt_MM1 and MM2 of an EEPROM corresponding to a nonvolatile memory element in accordance with the result of measurements of the leakage currents at the wafer manufacturing stage. Consequently, it is possible to compensate for variations in threshold voltages of the PMOS and NMOS of the SRAM memory cell at the wafer manufacturing stage as has already been described.

However, the values of the threshold voltages of the PMOSs and NMOSs of the SRAM memory cell vary depending upon variations with time due to LSI's harsh stress over a long period of time. In the chip of the MOSLSI shown in FIG. 12, a control unit Cont measures the leakage currents of the PMOSs and NMOS of the SRAM memory cell regularly on a on-chip basis in accordance with a maintenance program stored in the EEPORM corresponding to the nonvolatile memory element. The leakage current flowing through the PMOSs can be measured by a first sense circuit Idd Sense coupled between an external source or power supply Ext_Vdd and the source of each PMOS. The leakage current flowing through the NMOSs can be measured by a second sense circuit Iss_Sense coupled between an external ground Ext_Vss and the source of each NMOS. When the measured leakage currents are varying from the previous values exceeding a predetermined allowable range, the control unit Cont programs new compensation data into their corresponding control memories Cnt_MM1 and MM2 of the EEPROM corresponding to the nonvolatile memory element on a nonvolatile basis. Consequently, it is possible to compensate for variations in the threshold voltages of the PMOSs and NMOSs of a core CMOS logic circuit Core due to the variations with time due to the LSI's harsh stress over a long period of time.

In the chip of the MOSLSI shown in FIG. 20, a power switch Vdd_SW is coupled between the external power supply Ext_Vdd and an SRAM internal power supply or source voltage Vdd. A ground switch Vss_SW is coupled between the external ground Ext_Vss and an SRAM internal ground voltage Vss. The power switch Vdd_SW includes PMOSs Qp10, Qp11 and Qp12, and the ground switch Vss_SW includes NMOSs Qn10, Qn11 and Qn12. The PMOS Qp10 of the power switch Vdd_SW is on/off-controlled by a control signal ON_Vdd, and the NMOS Qn10 of the ground switch Vss_SW is on/off-controlled by a control signal ON_Vss. The PMOS Qp11 of the power switch Vdd_SW is diode-connected and the NMOS Qn11 of the ground switch Vss_SW is also diode-connected. The gate of the PMOS Qp12 of the power switch Vdd_SW is coupled to the ground voltage Vss, and the gate of the NMOS Qn11 of the ground switch Vss_SW is also coupled to the source voltage Vdd.

During a period for a normal operation like an information holding operation, a write operation and a read operation of each SRAM memory cell, the control signal ON_Vdd supplied to the PMOS Qp10 of the power switch Vdd_SW is set to a low level, and the control signal ON_Vss supplied to the NMOS Qp10 of the ground switch Vss_SW is set to a high level. Thus, the PMOS Qp10 of the power switch Vdd_SW and the NMOS Qn10 of the ground switch Vss_Sw are respectively controlled to an on state.

During a period for a PMOS leakage current measuring operation for measuring leakage current of each PMOS of the SRAM memory cell, the control signal ON_Vdd supplied to the PMOS Qp10 of the power switch Vdd_SW is set to a low level, and the control signal ON_Vss supplied to the NMOS Qn10 of the ground switch Vss_SW is set to a low level. Thus, during the period for the PMOS leakage current measuring operation, the PMOS Qp10 of the power switch Vdd_SW is controlled to an on state, and the NMOS Qn10 of the ground switch Vss_SW is controlled to an off state. Hence, the level of the SRAM internal ground voltage Vss rises from an external ground Ext_Vss of 0 volts to a voltage of about 0.5 volts by relatively high impedance of the NMOS Qn11 and Q12 of the ground switch Vss_SW. On the other hand, the level of the SRAM internal source voltage Vdd is set to the level of an external power supply Ext_Vdd of 1.2 volts by relatively low impedance of the PMOS Qp10 of the power switch Vdd_SW. Thus, in the MOSLSI shown in FIG. 20, the PMOS Qp10 of the power switch Vdd_SW is controlled to the on state and the NMOS Qn10 of the ground switch Vss_SW is controlled to the off state, thereby making it possible to measure the total load leakage current of load PMOSs Qp1 and Qp2 of an SRAM memory cell array in a manner similar to the measurement time Test PMOS of FIG. 9.

During a period for an NMOS leakage current measuring operation for measuring leakage current of each NMOS of the SRAM memory cell, the control signal ON_Vdd supplied to the PMOS Qp10 of the power switch Vdd_SW is set to a high level, and the control signal ON_Vss supplied to the NMOS Qn10 of the ground switch Vss_SW is set to a high level. Thus, during the period for the NMOS leakage current measuring operation, the PMOS Qp10 of the power switch Vdd_SW is controlled to an off state, and the NMOS Qn10 of the ground switch Vss_SW is controlled to an on state. Hence, the level of the SRAM internal ground voltage Vss is set to the level of the external ground Ext_Vss of 0 volts by relatively low impedance of the NMOS Qn10 of the ground switch Vss_SW. On the other hand, the level of the SRAM internal source voltage Vdd is lowered from the external power supply Ext_Vdd of 1.2 volts to a voltage of about 0.7 volts by relatively high impedance of the PMOS Qp11 and Qp12 of the power switch Vdd_SW. Thus, in the MOSLSI shown in FIG. 20, the PMOS Qp10 of the power switch Vdd_SW is controlled to the off state and the NMOS Qn10 of the ground switch Vss_SW is controlled to the on state, thereby making it possible to measure a current of the sum of both the total driver leakage current of driver NMOSs Qn1 and Qn2 of the SRAM memory cell array and the total transfer leakage current of transfer NMOSs Qn3 and Qn4 thereof in a manner similar to the measurement time Test_NMOS of FIG. 9.

<<SOI Device>>

Figure 22:
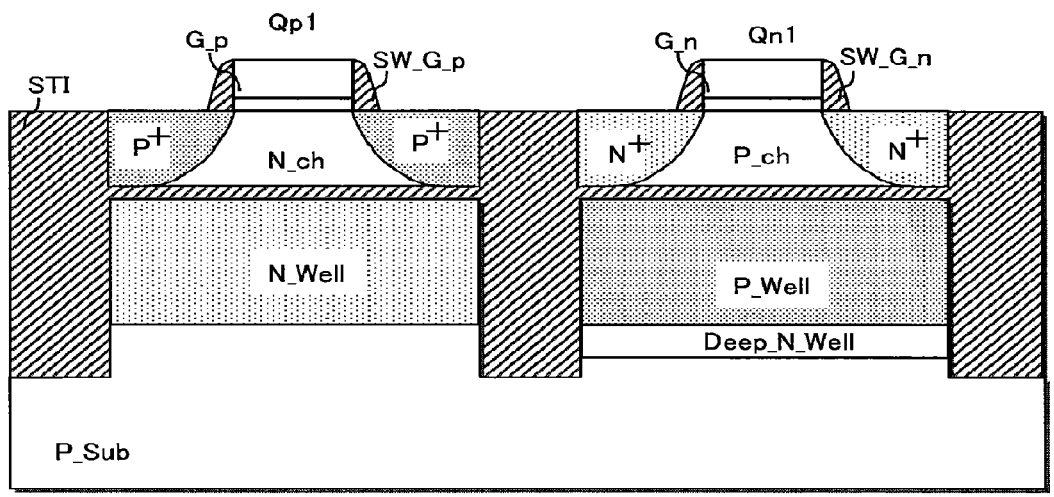
FIG. 22 is a diagram showing a sectional structure of a semiconductor integrated circuit according to a still further embodiment of the present invention.

FIG. 22 is a diagram showing a sectional structure of a semiconductor integrated circuit according to a still further embodiment of the present invention. A MOSLSI shown in FIG. 22 adopts an SOI structure. Incidentally, SOI is an abbreviation of "Silicon-On-Insulator".

As shown in FIG. 22, the SOI structure has, for example, a P-type silicon substrate P_Sub provided at its lower layer. An N well N_Well and a P well P_Well are formed in the surface of the lower silicon substrate P_Sub. Incidentally, an STI layer used as an insulator device isolation region is formed between the N well N_Well and the P well P_Well. Incidentally, STI is an abbreviation of "Shallow Trench Isolation".

A thin insulator is formed in the surface of the silicon substrate P_Sub formed with the N well N_Well and the P well P_Well.

A silicon layer is formed over the thin insulator. A P-type source region and a P-type drain region for a PMOS Qp1, both having a high impurity concentration, and an N-type channel region controlled to ultralow dose are formed to the left of the silicon layer. An N-type source region and an N-type drain region for an NMOS Qn1, both having a high impurity concentration, and a P-type channel region controlled to ultralow dose are formed to the right of the silicon layer.

Since an oxide film used as a thin insulting film or insulator is embedded into the silicon layer, the thin insulator is called buried oxide (BOX). The N-type channel region for the PMOS Qp1, which has been controlled to the ultralow dose, is fully depleted. The P-type channel region for the NMOS Qn1, which has been controlled to the ultralow dose, is fully depleted. Thus, the PMOS Qp1 and NMOS Qn1 are fully-depleted (FD) SOI transistors. The threshold voltages of the PMOS Qp1 and NMOS Qn1 corresponding to the fully-depleted SOI transistors can be controlled by body bias voltages of the N well N_Well and P well P_Well provided directly below a thin insulator or gate oxide called "back gate". Since such BOX FD-SOI transistors are capable of greatly reducing junction capacitances between the drains and wells, they are most suitable for a fast/low power consumption CMOS·SRAM.

While the invention made above by the present inventors has been described specifically on the basis of the preferred embodiments, the present invention is not limited to the embodiments referred to above. It is needless to say that various changes can be made thereto within the scope not departing from the gist thereof.

The present invention is also applicable even to a system LSI including an SRAM. Event at other than the system LSI, the present invention can widely be applied upon manufacturing a semiconductor integrated circuit fit for various uses, of a microprocessor and a baseband signal processing LSI with a high manufacturing yield and reducing variations in operation power consumption and signal delay amount for signal processing in an active mode.

What is claimed is:

1. A semiconductor integrated circuit comprising:
   a static random access memory (SRAM) provided on a large scale integrated circuit (LSI) chip, the SRAM including:
   a pair of bit lines,
   a word line, and
   a memory cell including a pair of load transistors coupled to first and second storage nodes, a pair of drive transistors coupled to the first and second storage nodes, and a pair of transfer transistors, a first transfer transistor of the transfer transistor pair being coupled between one of the bit lines of the pair of bit lines and the first storage node, and a second transfer transistor of the transfer transistor pair being coupled between the other bit line of the pair of bit lines and the second storage node, the first and second transfer transistors of the transfer transistor pair having respective gate electrodes coupled to the word line commonly, wherein the pair of load transistors are P type transistors provided on an N well of the LSI chip, and the pair of drive transistors and the pair of transfer transistors are N type transistors provided on a P well of the LSI chip;
   a control switch to supply selectively at least first and second voltages, which are different voltages from each other, for the N well and to supply selectively at least third and fourth voltages, which are different voltages from each other, for the P well; and
   a nonvolatile memory which stores first information indicative of which of at least the first and second voltages is supplied for the N well by the control switch, and which stores second information indicative of which of at least the third and fourth voltages is supplied for the P well by the control switch.

2. The semiconductor integrated circuit according to claim 1, wherein
   the first voltage is supplied to sources of the pair of load transistors,
   the second voltage is higher than the first voltage, and the third voltage is supplied to sources of the pair of drive transistors, and
   the fourth voltage is lower than the third voltage.

3. The semiconductor integrated circuit according to claim 1, wherein
   the first voltage is supplied to sources of the pair of load transistors,
   the second voltage is lower than the first voltage, and the third voltage is supplied to sources of the pair of drive transistors, and
   the fourth voltage is higher than the third voltage.

4. The semiconductor integrated circuit according to claim 1,
   wherein the control switch supplies selectively the first and second voltages and a fifth voltage for the N well and supplies selectively the third and fourth voltages and a sixth voltage for the P well,
   the fifth voltage is supplied to sources of the pair of load transistors, and
   the first voltage is higher than the fifth voltage, the second voltage is lower than the first voltage, the sixth voltage is supplied to sources of the pair of drive transistors, the third voltage is higher than the sixth voltage, and the fourth voltage is lower than the third voltage.

* * * * *